United States Patent
Lee et al.

(10) Patent No.: US 11,069,597 B2
(45) Date of Patent: Jul. 20, 2021

(54) SEMICONDUCTOR CHIPS AND METHODS OF MANUFACTURING THE SAME

(71) Applicant: Samsung Electronics Co., Ltd., Suwon-si (KR)

(72) Inventors: Dae-suk Lee, Suwon-si (KR); Hak-seung Lee, Seoul (KR); Dong-chan Lim, Hwaseong-si (KR); Tae-seong Kim, Suwon-si (KR); Kwang-jin Moon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 40 days.

(21) Appl. No.: 16/366,267

(22) Filed: Mar. 27, 2019

(65) Prior Publication Data

US 2020/0075458 A1 Mar. 5, 2020

(30) Foreign Application Priority Data

Sep. 3, 2018 (KR) .................. 10-2018-0104738

(51) Int. Cl.
*H01L 23/48* (2006.01)
*H01L 23/00* (2006.01)
(Continued)

(52) U.S. Cl.
CPC ...... *H01L 23/481* (2013.01); *H01L 21/76832* (2013.01); *H01L 21/76898* (2013.01);
(Continued)

(58) Field of Classification Search
CPC ................... H01L 21/76898; H01L 21/76832
See application file for complete search history.

(56) References Cited

U.S. PATENT DOCUMENTS 8,004,090 B2 8/2011 Uchiyama
8,471,367 B2 6/2013 Saito et al.
(Continued)

FOREIGN PATENT DOCUMENTS

EP 2317558 A2 5/2011
EP 2317558 A3 9/2012
(Continued)

OTHER PUBLICATIONS

Extended European Search Report dated Sep. 27, 2019 for corresponding European Application No. 19164595.1.

*Primary Examiner* — Moazzam Hossain
*Assistant Examiner* — Mohammad A Rahman
(74) *Attorney, Agent, or Firm* — Harness, Dickey & Pierce, P.L.C.

(57) ABSTRACT

Semiconductor chips and methods of manufacturing the same are provided. The semiconductor chip includes a substrate, an interlayer insulation layer including a bottom interlayer insulation layer on an upper surface of the substrate and a top interlayer insulation layer on the bottom interlayer insulation layer, an etch stop layer between the bottom interlayer insulation layer and the top interlayer insulation layer, a landing pad on the interlayer insulation layer, and a through via connected to the landing pad through the substrate, the interlayer insulation layer, and the etch stop layer. The etch stop layer is isolated from direct contact with the landing pad.

20 Claims, 20 Drawing Sheets

(51) Int. Cl.
  *H01L 21/768*  (2006.01)
  *H01L 23/31*   (2006.01)
  *H01L 23/522*  (2006.01)
  *H01L 23/532*  (2006.01)
  *H01L 25/18*   (2006.01)

(52) U.S. Cl.
  CPC ...... *H01L 23/3128* (2013.01); *H01L 23/5226* (2013.01); *H01L 23/53295* (2013.01); *H01L 24/08* (2013.01); *H01L 24/16* (2013.01); *H01L 25/18* (2013.01)

(56) References Cited

U.S. PATENT DOCUMENTS

| | | | |
|---|---|---|---|
| 8,691,686 B2 | 4/2014 | Mitsuhashi | |
| 9,219,032 B2 | 12/2015 | Ramachandran et al. | |
| 9,343,408 B2 | 5/2016 | Duong et al. | |
| 9,608,026 B2 | 3/2017 | Park et al. | |
| 9,633,929 B2 | 4/2017 | Yang et al. | |
| 2009/0200679 A1* | 8/2009 | Harada | H01L 27/14618 257/773 |
| 2010/0102454 A1 | 4/2010 | Akiyama | |
| 2012/0098106 A1 | 4/2012 | Aoki et al. | |
| 2012/0256324 A1 | 10/2012 | Liao et al. | |
| 2013/0264676 A1 | 10/2013 | Yang et al. | |
| 2014/0091414 A1* | 4/2014 | Shimotsusa | H01L 27/14636 257/431 |
| 2015/0076669 A1* | 3/2015 | Chang | H01L 21/76829 257/635 |
| 2015/0162343 A1* | 6/2015 | Park | H01L 27/11529 257/329 |
| 2017/0179021 A1 | 6/2017 | Cheng et al. | |
| 2019/0164748 A1* | 5/2019 | Chou | H01L 21/76895 |

FOREIGN PATENT DOCUMENTS

| | | |
|---|---|---|
| JP | 2012-222183 A | 11/2012 |
| JP | 5656341 B2 | 1/2015 |
| JP | 5873145 B2 | 3/2016 |
| JP | 6026756 B2 | 11/2016 |

\* cited by examiner

SEMICONDUCTOR CHIPS AND METHODS OF MANUFACTURING THE SAME

CROSS-REFERENCE TO RELATED APPLICATION

This application claims the benefit, under 35 U.S.C. § 119, of Korean Patent Application No. 10-2018-0104738, filed on Sep. 3, 2018, in the Korean Intellectual Property Office, the disclosure of which is incorporated herein in its entirety by reference.

BACKGROUND

The inventive concepts relate to semiconductor chips and methods of manufacturing the same, and more particularly, to semiconductor chips including a through silicon via and methods of manufacturing the same.

As three-dimensional (3D) semiconductor packages, each equipped with a plurality of semiconductor chips included in one semiconductor package, are actively developed, technology for securing the reliability of a connection structure by using a through silicon via which passes through a substrate or a die to form a vertically electrical connection may be developed.

SUMMARY

The inventive concepts provide semiconductor chips for securing the reliability of a connection structure by using a through silicon via.

The inventive concepts provide methods of manufacturing semiconductor chips which secure the reliability of a connection structure by using a through silicon via.

The inventive concepts are not limited to the aforesaid, but other example embodiments not described herein will be clearly understood by those of ordinary skill in the art from descriptions below.

According to some example embodiments, a semiconductor chip may include a substrate, an interlayer insulation layer including a bottom interlayer insulation layer on an upper surface of the substrate and a top interlayer insulation layer on the bottom interlayer insulation layer, an etch stop layer between the bottom interlayer insulation layer and the top interlayer insulation layer, a landing pad on the interlayer insulation layer, and a through via connected to the landing pad through the substrate, the interlayer insulation layer, and the etch stop layer. The etch stop layer may be isolated from direct contact with the landing pad.

According to some example embodiments, a semiconductor chip may include a substrate, an interlayer insulation layer on an upper surface of the substrate, the interlayer insulation layer surrounding a semiconductor device, an inter-metal insulation layer surrounding a metal wiring and including a bottom inter-metal insulation layer on the interlayer insulation layer and a top inter-metal insulation layer on the bottom inter-metal insulation layer, an etch stop layer between the bottom inter-metal insulation layer and the top inter-metal insulation layer, a landing pad on the inter-metal insulation layer, a bump structure on the landing pad, and a through via connected to the landing pad through the substrate, the interlayer insulation layer, the inter-metal insulation layer, and the etch stop layer. The etch stop layer may be isolated from direct contact with the landing pad.

According to some example embodiments, a method of manufacturing a semiconductor chip may include forming a semiconductor device on a first surface of a substrate, forming a bottom interlayer insulation layer on the first surface of the substrate, such that the bottom interlayer insulation layer surrounds the semiconductor device, forming an etch stop layer on the bottom interlayer insulation layer, forming a top interlayer insulation layer on the etch stop layer, forming a landing pad on the top interlayer insulation layer, such that the landing pad is isolated from direct contact with the etch stop layer, forming a preliminary through via hole that extends through the substrate, from a second surface of the substrate that is opposite to the first surface of the substrate, to expose the etch stop layer, forming a via insulation layer on an inner wall of the preliminary through via hole to define a through via hole, enlarging a floor of the through via hole to expose the landing pad, and forming a through via filling the through via hole.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Hereinafter, example embodiments will be described in detail with reference to the accompanying drawings.

Figure 1:
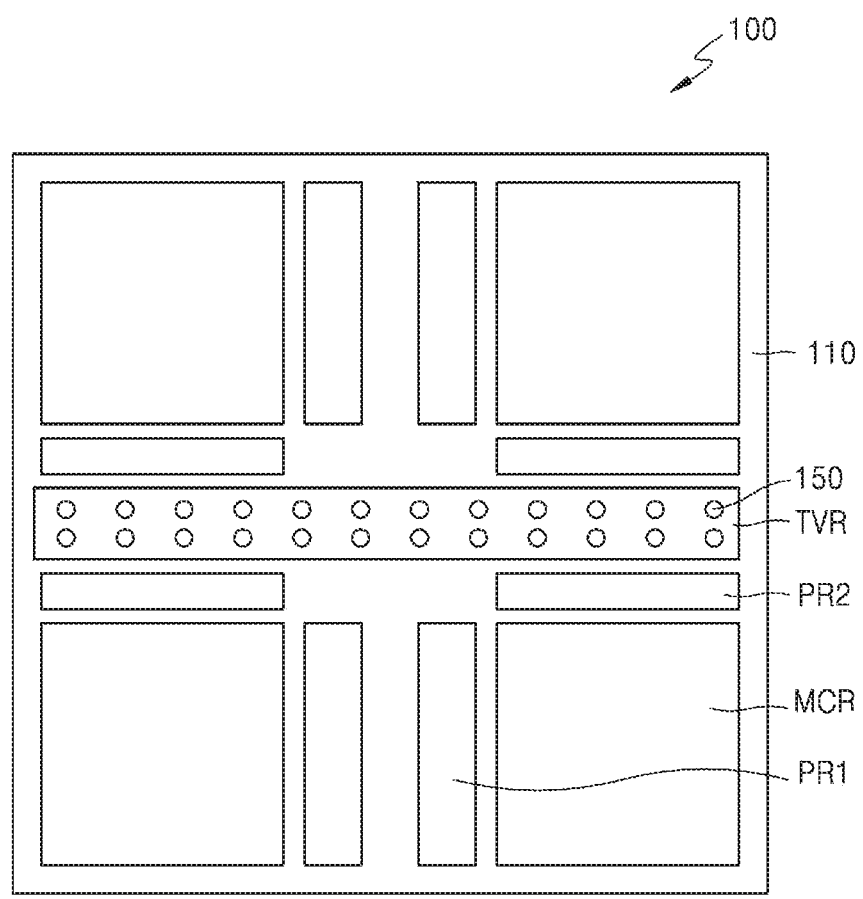
FIG. 1 is a plan view illustrating a semiconductor chip according to some example embodiments.
Figure 2:
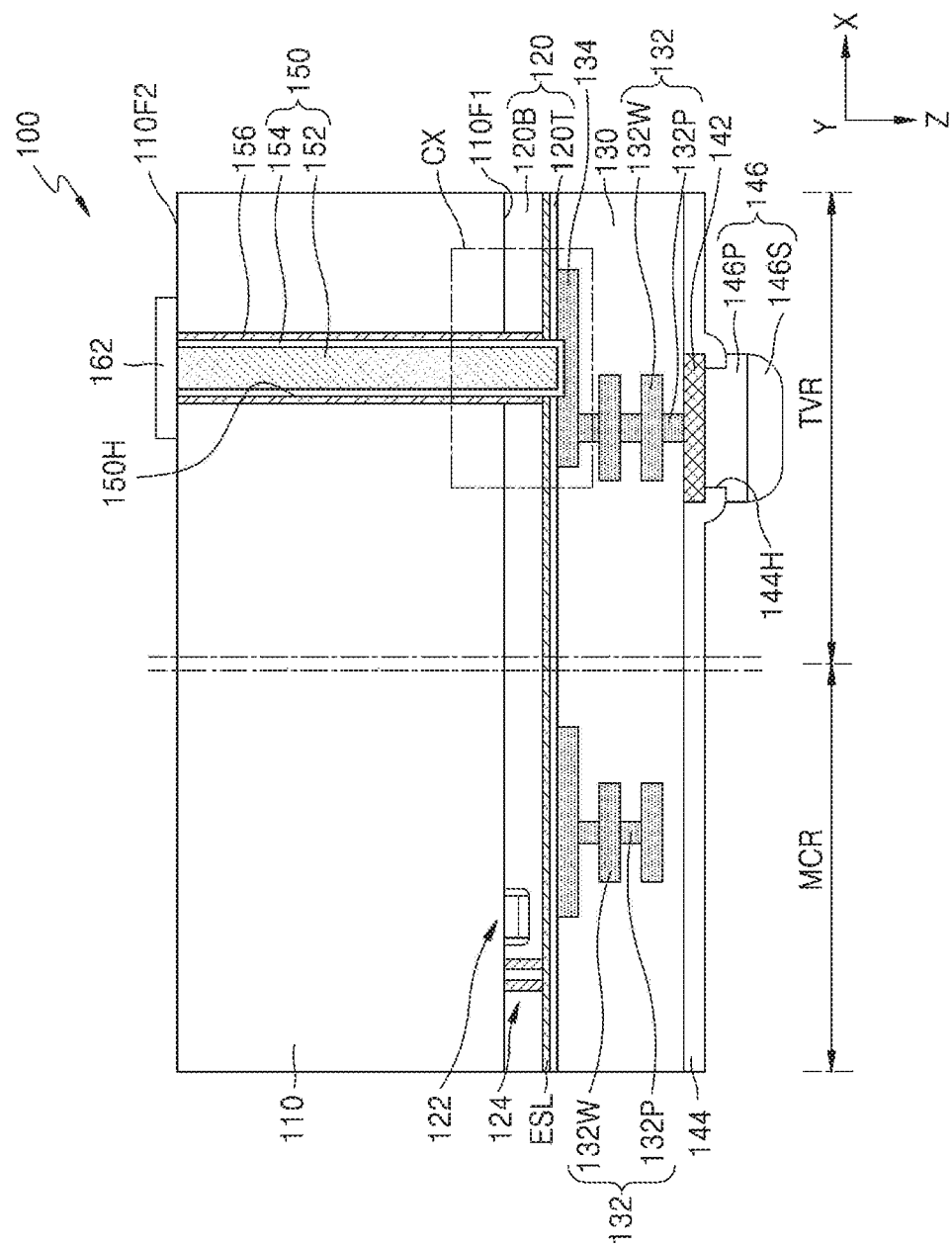
FIG. 2 is a cross-sectional view illustrating a portion of a main configuration region and a portion of a through via region of FIG. 1.
Figure 3:
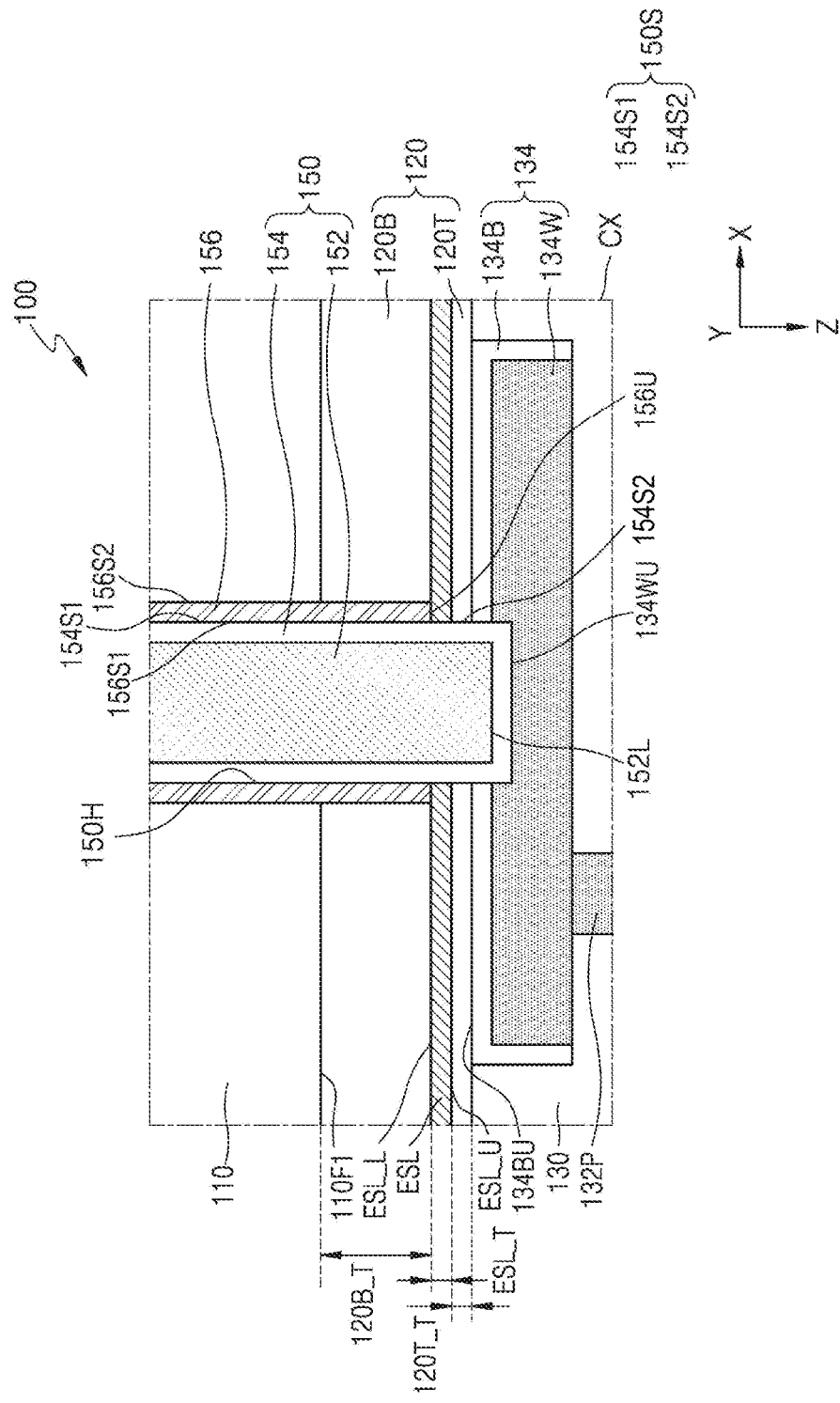
FIG. 3 is an enlarged view of a region CX of FIG. 2.

FIG. 1 is a plan view illustrating a semiconductor chip 100 according to some example embodiments. FIG. 2 is a cross-sectional view illustrating a portion of a main configuration region and a portion of a through via region of FIG. 1. FIG. 3 is an enlarged view of a region CX of FIG. 2.

Referring to FIGS. 1 to 3, the semiconductor chip 100 may include a substrate 110 which includes a plurality of main configuration regions MCR and a plurality of through via regions TVR.

A plurality of memory cells may be disposed in the plurality of main configuration regions MCR. A first peripheral circuit region PR1 may be disposed on one side of each of the plurality of main configuration regions MCR, and a second peripheral circuit region PR2 may be disposed on the other side of each of the plurality of main configuration regions MCR.

In some example embodiments, a row decoder connected to memory cells included in the plurality of main configuration regions MCR may be disposed in the first peripheral circuit region PR1, and a column decoder connected to the memory cells included in the plurality of main configuration regions MCR may be disposed in the second peripheral circuit region PR2.

In other embodiments, other driving elements such as a control logic, a sensing amplifier, and a page buffer for driving a plurality of memory cells may be further provided in the first and second peripheral circuit regions PR1 and PR2.

A plurality of through vias 150 passing through the substrate 110 may be disposed in the through via region TVR. A signal may be received through the through via 150 from an external terminal, or may be transmitted through the through vias 150 to the external terminal.

Disposition of the main configuration region MCR, the first and second peripheral circuit regions PR1 and PR2, and the through via region TVR is illustrated in the drawing, but may be modified without being limited thereto. In other embodiments, unlike the illustration, the main configuration regions MCR may be disposed in a center of the substrate 110, and the first and second peripheral circuit regions PR1 and PR2 and the through via region TVR may be disposed to one-dimensionally surround the main configuration regions MCR.

The substrate 110 may include a first surface 110F1 and a second surface 110F2. The substrate 110 may include a semiconductor substrate such as silicon (Si), germanium (Ge), silicon carbide (SiC), gallium arsenic (GaAs), indium arsenic (InAs), or indium phosphide (InP). In some example embodiments, the substrate 110 may have a silicon-on insulator (SOI) structure. For example, the substrate 110 may include a buried oxide (BOX) layer. In some example embodiments, the substrate 110 may include a conductive region (for example, an impurity-doped well or an impurity-doped structure). Also, the substrate 110 may have various isolation structures such as a shallow trench isolation (STI) structure.

The first surface 110F1 of the substrate 110 may be referred to as an active surface. An interlayer insulation layer 120 may be disposed on the first surface 110F1 of the substrate 110. The interlayer insulation layer 120 may be disposed to surround a plurality of semiconductor devices 122 and a wiring structure 124 each provided on the substrate 110. The plurality of semiconductor devices 122 may each include a memory device or a logic device.

The memory device may be a volatile or non-volatile memory device. The volatile memory device may include, for example, a volatile memory device such as dynamic random access memory (DRAM), static random access memory (SRAM), or thyristor random access memory (TRAM) and a volatile memory device, which is being currently developed. Also, the non-volatile memory device may include, for example, a non-volatile memory device such as flash memory, magnetic random access memory (MRAM), spin-transfer torque MRAM (STT-MRAM), ferroelectric random access memory (FRAM), phase change random access memory (PRAM), or resistance random access memory (RRAM) and a non-volatile memory device, which is being currently developed.

The logic device may be implemented as, for example, a microprocessor, a graphics processor, a signal processor, a network processor, a chipset, an audio codec, a video codec, an application processor, or a system-on chip (SOC), but is not limited thereto.

The plurality of semiconductor devices 122 may be electrically connected to the wiring structure 124 and may be surrounded by the interlayer insulation layer 120. The interlayer insulation layer 120, the plurality of semiconductor devices 122 surrounded by the interlayer insulation layer 120, and the wiring structure 124 may be referred to as a front-end-of-line (FEOL) structure, such that the semiconductor chip 100 as shown in FIG. 1 includes a FEOL structure on the upper surface of the substrate 110 (110F1). As described herein, the interlayer insulation layer 120 may be a portion of the FEOL structure.

The interlayer insulation layer 120 may include a low dielectric material having a dielectric constant that is lower than that of silicon oxide, silicon nitride, silicon oxynitride, or silicon oxide. The low dielectric material included in the interlayer insulation layer 120 may be a material having a dielectric constant which is lower than that of silicon oxide and may have an improved insulation function which enables the semiconductor chip 100 to be highly integrated and to have a high speed.

In the semiconductor chip 100 according to some example embodiments, the interlayer insulation layer 120 may include a bottom interlayer insulation layer 120B disposed between the first surface 110F1 of the substrate 110 and an etch stop layer ESL and a top interlayer insulation layer 120T disposed on the etch stop layer ESL, with respect to a position of the etch stop layer ESL. That is, the semiconductor chip 100 may be provided in a stacked structure where the etch stop layer ESL is disposed on the bottom interlayer insulation layer 120B and the top interlayer insulation layer 120T is disposed on the etch stop layer ESL. Restated, in some example embodiments, including the example embodiments shown in FIGS. 1-3, the first surface 110F1 of the substrate 110 may be referred to as an upper surface of the substrate 110, and the interlayer insulation layer 120 may be understood to include a bottom interlayer insulation layer 120B on the upper surface of the substrate 110 and a top interlayer insulation layer 120T on the bottom interlayer insulation layer 120B, where the etch stop layer ESL is between the bottom interlayer insulation layer 120B and the top interlayer insulation layer 120T.

It will be understood that an element that is described as being "on" another element may be "above" or "beneath" the other element. In addition, it will be understood that an element that is described as being "on" another element may be "directly" on the other element, such that the elements are in direct contact with each other, or the element may be "indirectly" on the other element, such that the elements are isolated from direct contact with each other by one or more interposing spaces and/or structures.

In some example embodiments, the bottom interlayer insulation layer 120B may be provided in a structure where silicon oxides such as phosphor silicate glass (PSG), borophosphor silicate glass (BPSG), undoped silicate glass (USG), tetra ethyl ortho silicate (TEOS), plasma enhanced-TEOS (PE-TEOS), and high density plasma-chemical vapor deposition (HDP-CVD) oxides are arranged on a single layer or are stacked.

The etch stop layer ESL may be disposed between the bottom interlayer insulation layer 120B and the top interlayer insulation layer 120T forming the interlayer insulation layer 120. Also, the etch stop layer ESL may be apart from ("isolated from direct contact with") a landing pad 134 by at least the top interlayer insulation layer 120T.

In some example embodiments, a thickness 120B_T of the bottom interlayer insulation layer 120B may be greater than a thickness ESL_T of the etch stop layer ESL, and the thickness ESL_T of the etch stop layer ESL may be substantially equal to or greater than a thickness 120T_T of the top interlayer insulation layer 120T. As described herein, a thickness that is "substantially" equal to another thickness will be understood to be equal to the other thickness within manufacturing tolerances and/or material tolerances.

Generally, in an etching process of forming a through via hole 150H, some of metal materials included in the landing pad 134 may be exposed due to an etch distribution of each of a center portion and a peripheral portion of the substrate 110 and a thickness distribution of the interlayer insulation layer 120. Therefore, in the etching process of forming the through via hole 150H, the etch stop layer ESL may solve a problem where an upper surface of the landing pad 134 is exposed at an undesired process stage due to over-etching.

A material included in the etch stop layer ESL may have an etch selectivity with respect to a material included in the bottom interlayer insulation layer 120B. For example, when the bottom interlayer insulation layer 120B includes silicon oxide, the etch stop layer ESL may include silicon nitride.

As described above, since the etch stop layer ESL is disposed between the bottom interlayer insulation layer 120B and the top interlayer insulation layer 120T of the interlayer insulation layer 120, the etching process of forming the through via hole 150H may include a process of exposing the etch stop layer ESL and a process of exposing the upper surface of the landing pad 134, thereby maximally decreasing a degree to which the upper surface of the landing pad 134 is exposed at an undesired process stage due to an etch distribution.

An inter-metal insulation layer 130 may be disposed on the interlayer insulation layer 120, and the inter-metal insulation layer 130 may be disposed to surround a multilayer wiring structure 132 disposed on the interlayer insulation layer 120. The multilayer wiring structure 132 may include a plurality of wiring layers 132W and a plurality of wiring vias 132P. The multilayer wiring structure 132 may be referred to herein as simply "metal wiring." In some example embodiments, the inter-metal insulation layer 130 may have a stacked structure of a plurality of insulation layers, and each of the plurality of insulation layers may be disposed to surround a portion of a corresponding wiring layer of the plurality of wiring layers 132W and a portion of a corresponding wiring via of the plurality of wiring vias 132P. The inter-metal insulation layer 130 and the multilayer wiring structure 132 surrounded by the inter-metal insulation layer 130 may be referred to as a back-end-of-line (BEOL) structure. Accordingly, it will be understood that the semiconductor chip 100 shown in FIG. 1 may include a BEOL structure on the FEOL structure of the semiconductor chip 100.

As shown in at least FIGS. 1-3, the landing pad 134 may be on the interlayer insulation layer 120, and at least a portion of the landing pad 134 may be surrounded by the inter-metal insulation layer 130. The landing pad 134 may be a portion of the multilayer wiring structure 132 disposed in the through via region TVR.

The landing pad 134 may include a landing pad metal layer 134W and a landing pad barrier layer 134B. The landing pad barrier layer 134B may be disposed to surround an upper surface 134WU and a side surface of the landing pad metal layer 134W.

Here, a surface disposed closer to the interlayer insulation layer 120 or the substrate 110 among two surfaces of the landing pad barrier layer 134B extending in a horizontal direction (an X or Y direction) may be referred to as an upper surface 134BU of the landing pad barrier layer 134B.

Moreover, a surface of the landing pad metal layer 134W facing the interlayer insulation layer 120 and extending in the horizontal direction (the X or Y direction) may be referred to as an upper surface 134WU of the landing pad metal layer 134W, and a surface opposite to the upper surface 134WU may be referred to as a lower surface of the landing pad metal layer 134W.

In some example embodiments, the landing pad metal layer 134W may include nickel (Ni), copper (Cu), aluminum (Al), gold (Au), tungsten (W), or a combination thereof, but is not limited thereto. The landing pad barrier layer 134B may include at least one material selected from among W, tungsten nitride (WN), tungsten carbide (WC), titanium (Ti), titanium nitride (TiN), tantalum (Ta), tantalum nitride (TaN), ruthenium (Ru), cobalt (Co), manganese (Mn), Ni, and nickel boron (NiB), but is not limited thereto.

A first pad 142 may be disposed on the inter-metal insulation layer 130, and a passivation layer 144 including an opening 144H exposing at least a portion of an upper surface of the first pad 142 may be disposed on the inter-metal insulation layer 130. The first pad 142 may include Al, Ni, Cu, or a combination thereof, and the passivation layer 144 may include polyimide or silicon nitride, but is not limited thereto.

A bump structure 146 including a pillar 146P and a solder layer 146S may be disposed on the first pad 142. The bump structure 146 may include the pillar 146P and the solder layer 146S, which are sequentially stacked on the first pad 142. In some example embodiments, the pillar 146P may include Cu, Ni, or an alloy thereof, and the solder layer 146S may include tin (Sn), silver (Ag), lead (Pb), Au, Cu, boron (B), or an alloy thereof. However, the pillar 146P and the solder layer 146S are not limited thereto.

As illustrated, the first pad 142 and the bump structure 146 may be disposed in the through via region TVR, and optionally, the first pad 142 and the bump structure 146 may be further provided in the main configuration region MCR.

The through vias 150 may pass ("extend") through the substrate 110 and the interlayer insulation layer 120 and may be electrically connected to the landing pad 134. The through vias 150 may include a conductive plug 152 and a conductive barrier layer 154.

The through vias 150 may be disposed in the through via hole 150H passing through the substrate 110 and the interlayer insulation layer 120. Accordingly, and as shown in at least FIG. 2, a through via 150 may extend through the substrate 110, the interlayer insulation layer 120, and the etch stop layer ESL such that the through via 150 is connected to the landing pad 134 through the substrate 110, the interlayer insulation layer 120, and the etch stop layer ESL. The through via hole 150H may extend from the second surface 110F2 to the first surface 110F1 of the substrate 110 in a vertical direction (a Z direction), and the conductive barrier layer 154 and the conductive plug 152 may be sequentially disposed on an inner wall of the through via hole 150H.

The conductive plug 152 may extend via the first surface 110F1 from the second surface 110F2 of the substrate 110, and a floor surface 152L of the conductive plug 152 may be disposed in a level which is lower than a floor surface of the interlayer insulation layer 120. In other words, the floor surface 152L of the conductive plug 152 may be disposed farther away from the first surface 110F1 of the substrate 110 than a floor surface of the interlayer insulation layer 120.

In some example embodiments, the conductive plug 152 may include Cu, copper tin (CuSn), copper magnesium (CuMg), copper nickel (CuNi), copper zinc (CuZn), copper palladium (CuPd), copper gold (CuAu), copper rhenium (CuRe), copper tungsten (CuW), W, or a W alloy, but is not limited thereto.

The conductive barrier layer 154 may be disposed to surround a sidewall and the floor surface 152L of the conductive plug 152. In some example embodiments, the conductive barrier layer 154 may include at least one material selected from among W, WN, WC, Ti, TiN, Ta, TaN, Ru, Co, Mn, WN, Ni, and NiB, but is not limited thereto.

A via insulation layer 156 may surround a large portion of a sidewall of the conductive barrier layer 154 that is a limited portion of the sidewall of the through via 150. For example, as shown in at least FIG. 3, the via insulation layer 156 may surround a large portion of the sidewall of the through via 150, such that a first portion 154S1 of the sidewall of the conductive barrier layer 154, which provides a first portion of the sidewall of the through via 150, is covered by the via insulation layer 156 and a second portion 154S2 of the sidewall of the conductive barrier layer 154, which provides a second portion of the sidewall of the through via 150, is exposed by the via insulation layer 156. The via insulation layer 156 may act as an insulation spacer which prevents the substrate 110 from directly contacting a conductive material included in the through via 150. Also, the via insulation layer 156 may directly contact the etch stop layer ESL and may be disposed apart from ("isolated from direct contact with") the landing pad 134, such that the via insulation layer 156 does not directly contact the landing pad 134. As shown in at least FIG. 3, the portions 154S1 and 154S2 may collectively comprise a sidewall 150S of the through via 150 that directly contacts the via insulation layer 156, the etch stop layer ESL, the top interlayer insulation layer 120T, and the landing pad 134. As further shown in FIGS. 2-3, one sidewall 156S1 of the via insulation layer 156 may directly contact the through via 150, and another sidewall 156S2 of the via insulation layer 156 may directly contact the substrate 110 and the bottom interlayer insulation layer 120B. Additionally, an upper surface 156U of the via insulation layer 156, that is opposite to the upper surface of the substrate 110 (110F1) may directly contact the layer surface ESL_L of the etch stop layer ESL.

The via insulation layer 156 may include silicon oxide, silicon nitride, silicon carbide, polymer, or a combination thereof. In some example embodiments, a chemical vapor deposition (CVD) process may be used for forming the via insulation layer 156. The via insulation layer 156 may have a thickness of about 500 Å to about 3000 Å, but is not limited thereto.

Moreover, one sidewall of the via insulation layer 156 may directly contact the through via 150, and the other sidewall of the via insulation layer 156 may directly contact the substrate 110 and the interlayer insulation layer 120. An upper surface of the via insulation layer 156 may have a structure which directly contacts a lower surface ESL_L of the etch stop layer ESL. As shown in FIG. 3, the lower surface ESL_L of the etch stop layer ESL that faces the upper surface of the substrate 110 (110F1) may directly contact the via insulation layer 156 and the bottom interlayer insulation layer 120B. As further shown in FIG. 3, an upper surface ESL_U of the etch stop layer ESL, which is opposite to the upper surface of the substrate 110 (110F1) may directly contact the top interlayer insulation layer 120T and may not directly contact the via insulation layer 156 and the landing pad 134.

That is, in terms of the through via 150, a sidewall of the through via 150 may have a structure which directly contacts the via insulation layer 156, the etch stop layer ESL, the bottom interlayer insulation layer 120B, and the landing pad 134.

The second surface 110F2 of the substrate 110 may be referred to as an inactive surface. A second pad 162 connected to the through via 150 may be disposed on the second surface 110F2 of the substrate 110. The second pad 162 may include Al, Ni, Cu, or a combination thereof, but is not limited thereto.

As illustrated, the through via 150 may pass through the substrate 110 and the interlayer insulation layer 120 and may be electrically connected to the landing pad 134. The conductive plug 152 may be disposed in order for only the conductive barrier layer 154 to directly contact the landing pad metal layer 134W without directly contacting the landing pad metal layer 134W.

Although described below, a method of manufacturing the semiconductor chip 100 according to some example embodiments may use a via last method corresponding to a method where the landing pad 134 and the inter-metal insulation layer 130 are first formed on the first surface 110F1 of the substrate 110 so as to form the through via 150, and then, the through via 150 is formed.

Generally, a method of forming the through via 150 may include a via first method, a via middle method, and a via last method. The via first method may denote a method of forming the through via 150 before forming an integrated circuit of a semiconductor device, the via middle method may denote a method of forming the through via 150 before a wiring layer is formed after forming the integrated circuit of the semiconductor device, and the via last method may denote a method of forming the through via 150 after the wiring layer is formed.

For example, in the via last method, the plurality of semiconductor devices 122, the wiring structure 124, and the interlayer insulation layer 120 may be formed on the first surface 110F1 of the substrate 110, the landing pad 134, the multilayer wiring structure 132, and the inter-metal insulation layer 130 may be formed on the interlayer insulation layer 120, and the through via hole 150H passing through the substrate 110 and the interlayer insulation layer 120 from the second surface 110F2 of the substrate 110 may be formed.

Particularly, in the method of manufacturing the semiconductor chip 100 according to some example embodiments, a preliminary through via hole 150HP (see FIG. 10) extending to the inside of the interlayer insulation layer 120 through the substrate 110 and exposing the etch stop layer ESL may be first formed, the via insulation layer 156 may be formed on an inner wall of the preliminary through via hole 150HP (see FIG. 10), a floor of the through via hole 150H may be more enlarged until the upper surface 134WU of the landing pad metal layer 134W is exposed, and the conductive barrier layer 154 may be formed on the inner wall of the through via hole 150H.

In a semiconductor chip differing from the semiconductor chip 100 according to some example embodiments, the etch stop layer ESL may be omitted, and the through via hole 150H may be formed through a one-time etching process. In this case, due to an etch distribution, a portion of the landing pad metal layer 134W may be etched when forming the through via hole 150H, and a metal material included in an exposed landing pad metal layer 134W may remain in the through via hole 150H without being removed and may be attached on a sidewall of the through via hole 150H (for example, the substrate 110 or the interlayer insulation layer 120). Therefore, the substrate 110 or the interlayer insulation layer 120 may be polluted by the metal material, and due to this, a sufficient insulation characteristic of the substrate 110 or the interlayer insulation layer 120 may not be secured.

On the other hand, in the semiconductor chip 100 according to some example embodiments, since the etch stop layer ESL is disposed between the bottom interlayer insulation layer 120B and the top interlayer insulation layer 120T of the interlayer insulation layer 120, the etching process of forming the through via hole 150H may include the process of exposing the etch stop layer ESL and the process of exposing the upper surface of the landing pad 134.

Therefore, a degree to which the upper surface of the landing pad 134 is exposed at an undesired process stage due to an etch distribution may be maximally reduced. Also, after the process of exposing the etch stop layer ESL, the via insulation layer 156 may be conformally formed on the sidewall of the preliminary through via hole 150HP (see FIG. 10) and an exposed etch stop layer ESL, and thus, the via insulation layer 156 may act as a protection layer which protects a surface of each of the substrate 110 and the interlayer insulation layer 120.

Therefore, in a process of exposing an upper surface of the landing pad 134, a metal material included in the landing pad metal layer 134W may not be directly adhered to a sidewall of the substrate 110 or the interlayer insulation layer 120, and thus, the metal material may be prevented from being polluted in the substrate 110 or the interlayer insulation layer 120, whereby the semiconductor chip 100 may have good reliability.

Figure 4:
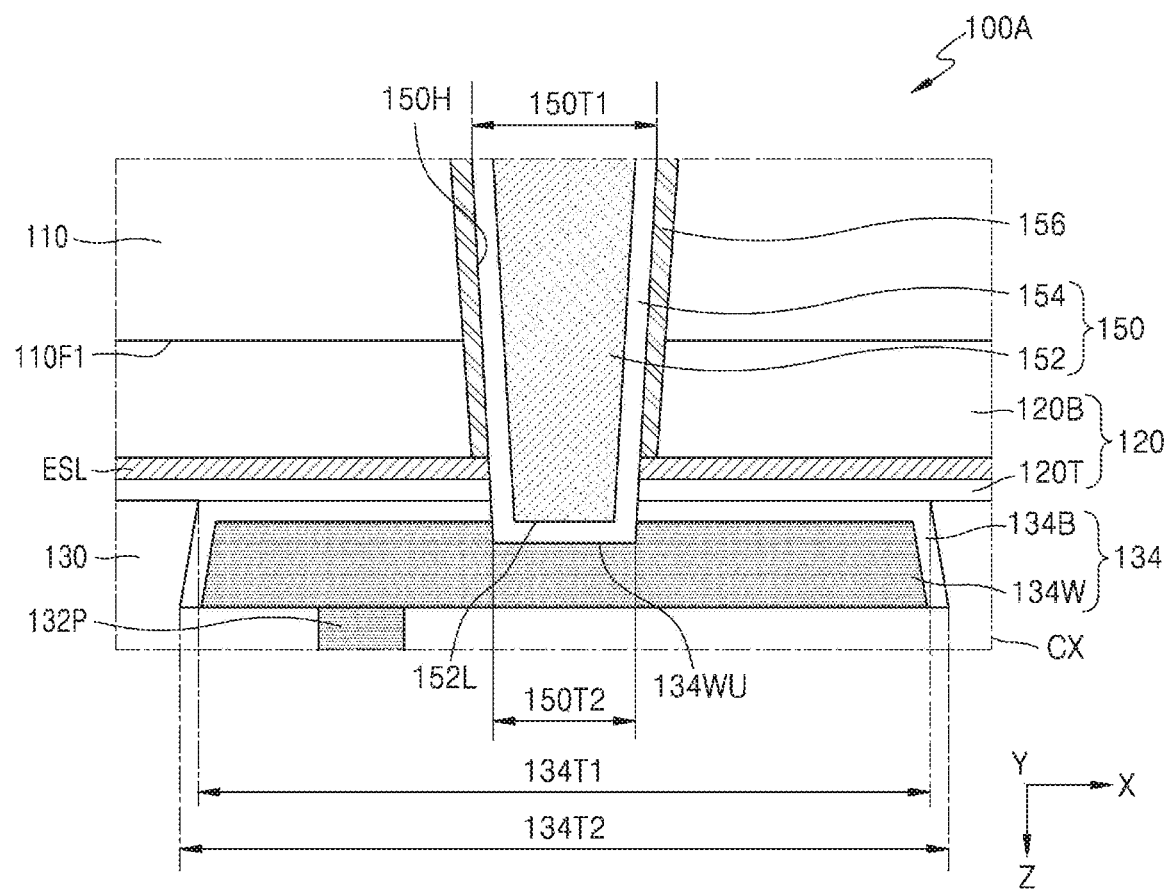
FIG. 4 is a cross-sectional view illustrating a semiconductor chip according to some example embodiments.

FIG. 4 is a cross-sectional view illustrating a semiconductor chip 100A according to some example embodiments and is an enlarged view corresponding to the region CX of FIG. 2.

Elements configuring the semiconductor chip 100A described below and a material included in each of the elements are substantially the same as (e.g., the same within manufacturing tolerances and/or material tolerances) or similar to descriptions given above with reference to FIGS. 1 to 3. Hereinafter, therefore, for convenience of description, a difference between the semiconductor chip 100A and the semiconductor chip 100 (see FIG. 3) will be mainly described.

Referring to FIG. 4, in the semiconductor chip 100A according to some example embodiments, a through via 150 and a landing pad 134 may each have a sidewall profile having a certain slope.

A process of forming a through via hole 150H may start from a second surface 110F2 of a substrate 110 and may be performed in a direction toward the landing pad 134. In terms of a characteristic of an anisotropy etching process of forming the through via hole 150H, a width of the through via hole 150H may be progressively reduced towards the landing pad 134.

Therefore, a profile of the through via 150 provided in the through via hole 150H may be based on a profile of the through via hole 150H. That is, the though via 150 may have a sidewall profile where a first width 150T1 of a portion directly contacting the substrate 110 is wider than a second width 150T2 of a portion directly contacting the landing pad 134. Accordingly, and as shown in FIG. 4, at least a portion of the through via 150 may have a cross-section width that is progressively and/or continuously narrowed in a direction extending along a longitudinal axis of at least the portion of the through via 150, away from the second surface 110F2 (e.g., bottom surface) of the substrate 110, and is progressively and/or continuously narrowed in proportion to distance of the cross-section of the portion of the through via 150 from the second surface 110F2 (e.g., bottom surface) of the substrate 110, such that the width of a given cross-section of the through via 150, in the portion of the through via 150, narrows in proportion to distance of the given cross section from the second surface 110F2 (e.g., bottom surface) of the substrate 110.

On the other hand, a process of forming a landing pad hole (not shown) may start from the inter-metal insulation layer 130 corresponding to a direction opposite to the second surface 110F2 of the substrate 110 and may be performed in a direction toward the interlayer insulation layer 120. In terms of a characteristic of an anisotropy etching process of forming the landing pad hole, a width of the landing pad hole may be progressively reduced towards the interlayer insulation layer 120.

Therefore, a profile of the landing pad 134 provided in the landing pad hole may be based on a profile of the landing pad hole. That is, the landing pad 134 may have a sidewall profile where a second width 134T2 of a portion spaced apart from the through via 150 is wider than a first width 134T1 of a portion directly contacting the through via 150. Accordingly, and as shown in FIG. 4, the landing pad 134 may have a cross-section width that is progressively and/or continuously widened in a direction extending along a longitudinal axis of the landing pad 134 away from the second surface 110F2 (e.g., bottom surface) of the substrate 110, where the longitudinal axis of the landing pad 134 may be the same as the longitudinal axis of the through via 150, and where the cross-section width of the landing pad 134 is progressively and/or continuously widened in proportion to distance of the cross-section of the landing pad 134 from the second surface 110F2 (e.g., bottom surface) of the substrate 110, such that the width of a given cross-section of the landing pad 134 widens in proportion to distance of the given cross section from the second surface 110F2 (e.g., bottom surface) of the substrate 110.

A method of manufacturing the semiconductor chip 100A according to some example embodiments, as described above, may use the via last method where the landing pad 134 and the inter-metal insulation layer 130 are first formed on the first surface 110F1 of the substrate 110 so as to form the through via 150, and then, the through via 150 is formed.

In this case, a direction in which an etching process of etching the through via hole 150H is performed may differ from a direction in which an etching process of etching the landing pad hole is performed, with respect to the substrate 110. Accordingly, as illustrated, at least a portion of the through via 150 may have a reverse trapezoid shape where a width thereof is progressively reduced away from the substrate 110, and the landing pad 134 may have a trapezoid shape where a width thereof is progressively widened away from the substrate 110.

Figure 5:
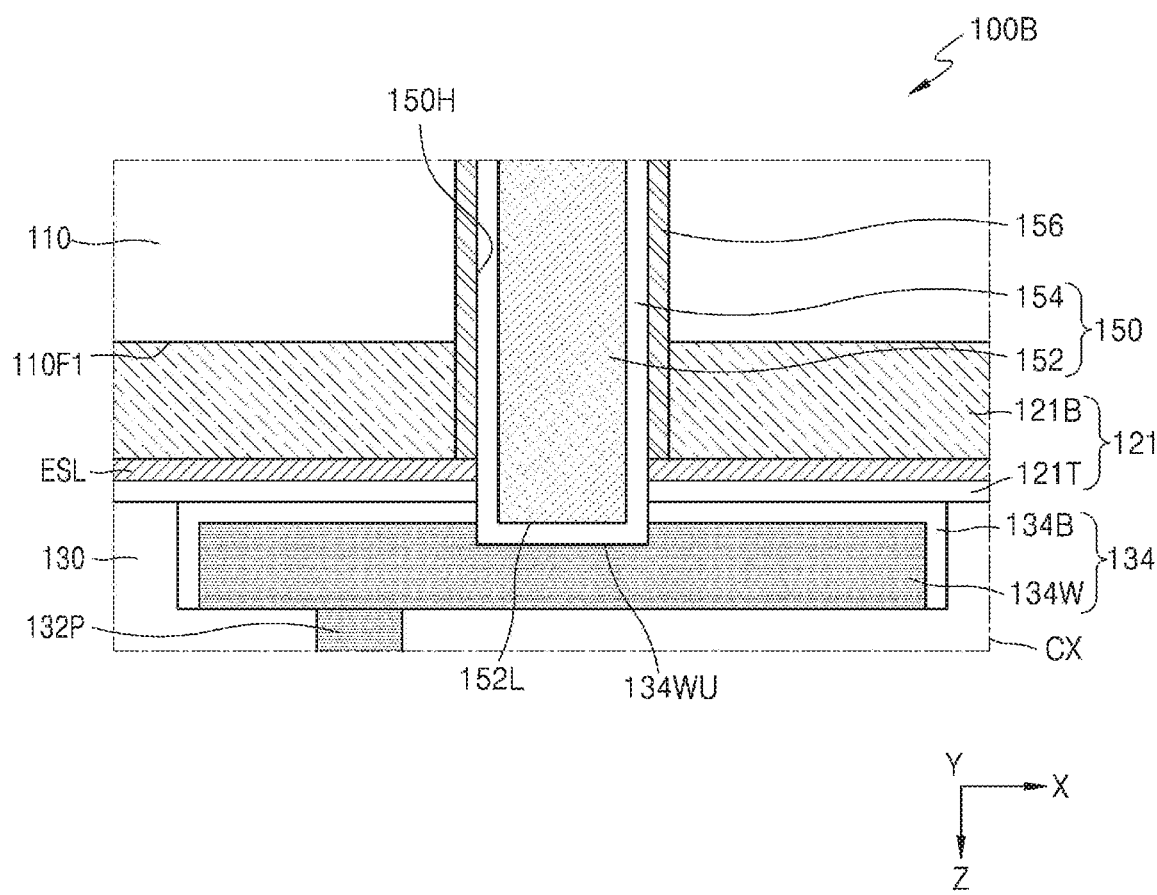
FIG. 5 is a cross-sectional view illustrating a semiconductor chip according to some example embodiments.

FIG. 5 is a cross-sectional view illustrating a semiconductor chip 100B according to some example embodiments and is an enlarged view corresponding to the region CX of FIG. 2.

Elements configuring the semiconductor chip 100B described below and a material included in each of the elements are substantially the same as or similar to descriptions given above with reference to FIGS. 1 to 3. Hereinafter, therefore, for convenience of description, a difference between the semiconductor chip 100B and the semiconductor chip 100 (see FIG. 3) will be mainly described.

Referring to FIG. 5, in the semiconductor chip 100B according to some example embodiments, a material included in a bottom interlayer insulation layer 121B may differ from a material included in a top interlayer insulation layer 121T. Restated, a material composition of the bottom interlayer insulation layer 121B may be different from a material composition of the top interlayer insulation layer 121T.

An interlayer insulation layer 121 may include the bottom interlayer insulation layer 121B disposed between a first surface 110F1 of the substrate 110 and an etch stop layer ESL and the top interlayer insulation layer 121T disposed on the etch stop layer ESL, with respect to a position of the etch stop layer ESL. That is, the semiconductor chip 100B may be provided in a stacked structure where the etch stop layer ESL is disposed on the bottom interlayer insulation layer 121B and the top interlayer insulation layer 121T is disposed on the etch stop layer ESL.

The bottom interlayer insulation layer 121B may be provided in a structure where silicon oxides such as PSG, BPSG, USG, TEOS, PE-TEOS, and HDP-CVD oxides are arranged on a single layer or are stacked. A material included in the etch stop layer ESL may have an etch selectivity with respect to a material included in ("a material of") the bottom interlayer insulation layer 120B. For example, when the bottom interlayer insulation layer 120B includes silicon oxide, the etch stop layer ESL may include silicon nitride. For example, when the bottom interlayer insulation layer 121B includes silicon oxide, the etch stop layer ESL may include silicon nitride.

In the semiconductor chip 100B according to some example embodiments, unlike the bottom interlayer insulation layer 121B, the material included in the top interlayer insulation layer 121T may have an etch rate which is equal to or similar to that of the material included in the etch stop layer ESL. That is, the material included in the bottom interlayer insulation layer 121B (e.g., the material composition of the bottom interlayer insulation layer 121B) may differ from the material included in the top interlayer insulation layer 121T (e.g., the material composition of the top interlayer insulation layer 121T).

Figure 6:
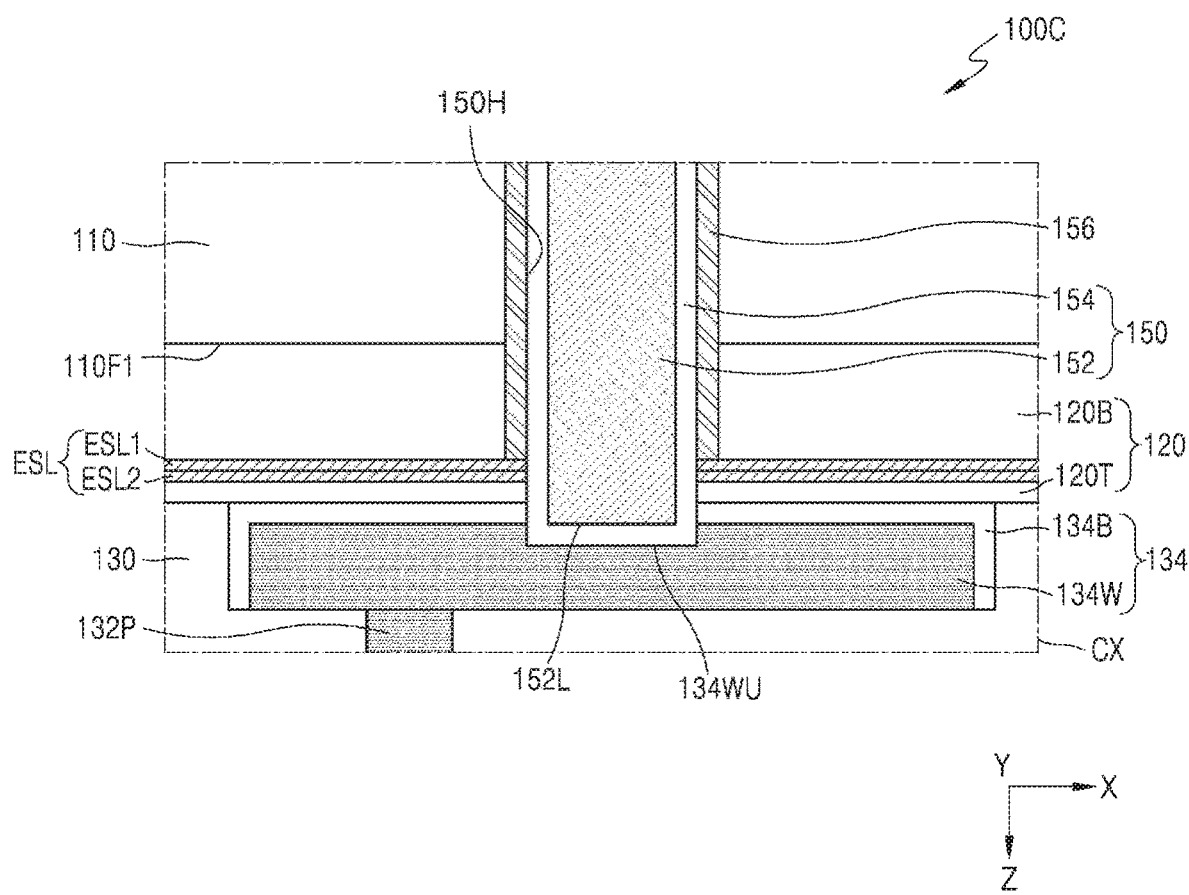
FIG. 6 is a cross-sectional view illustrating a semiconductor chip according to some example embodiments.

FIG. 6 is a cross-sectional view illustrating a semiconductor chip 100C according to some example embodiments and is an enlarged view corresponding to the region CX of FIG. 2.

Elements configuring the chip 100C described below and a material included in each of the elements are substantially the same as or similar to descriptions given above with reference to FIGS. 1 to 3. Hereinafter, therefore, for convenience of description, a difference between the semiconductor chip 100C and the semiconductor chip 100 (see FIG. 3) will be mainly described.

Referring to FIG. 6, the semiconductor chip 100C according to some example embodiments may include an etch stop layer ESL including a first etch stop layer ESL1 and a second etch stop layer ESL2.

In the semiconductor chip 100C according to some example embodiments, an interlayer insulation layer 120 may include a bottom interlayer insulation layer 120B directly contacting the first etch stop layer ESL1 and a top interlayer insulation layer 120T directly contacting the second etch stop layer ESL2, with respect to a position of the etch stop layer ESL. That is, the semiconductor chip 100C according to some example embodiments may be provided in a stacked structure where the first etch stop layer ESL1 is disposed on the bottom interlayer insulation layer 120B, the second etch stop layer ESL2 is disposed on the first etch stop layer ESL1, and the top interlayer insulation layer 120T is disposed on the second etch stop layer ESL2.

The etch stop layer ESL may be provided in a multiplayer structure where the first etch stop layer ESL1 and the second etch stop layer ESL2 are sequentially stacked. A thickness of the first etch stop layer ESL1 may be equal to or different from that of the second etch stop layer ESL2. In the drawing, the etch stop layer ESL is illustrated as including two layers (for example, the first etch stop layer ESL1 and the second etch stop layer ESL2) that are stacked, but is not limited thereto. In other embodiments, depending on the case, the etch stop layer ESL may include three or more layers.

Moreover, a material composition of the first etch stop layer ESL1 may differ from a material composition of the second etch stop layer ESL2. For example, the first etch stop layer ESL1 may include a material having an etch selectivity with respect to a material included in the bottom interlayer insulation layer 120B, and the second etch stop layer ESL2 may include the same material as that of the bottom interlayer insulation layer 120B. Accordingly, in some example embodiments, including the example embodiments shown in FIG. 6, the etch stop layer ESL may include a stack of a plurality of different material layers (e.g., the first and second etch stop layers ESL1 and ESL2).

In this manner, the first etch stop layer ESL1 and the second etch stop layer ESL2 may include different materials (e.g., have different material compositions) which enable an etching process to be easily performed on the through via hole 150H, based on a relative relationship between the bottom interlayer insulation layer 120B and the top interlayer insulation layer 120T.

Figure 7:
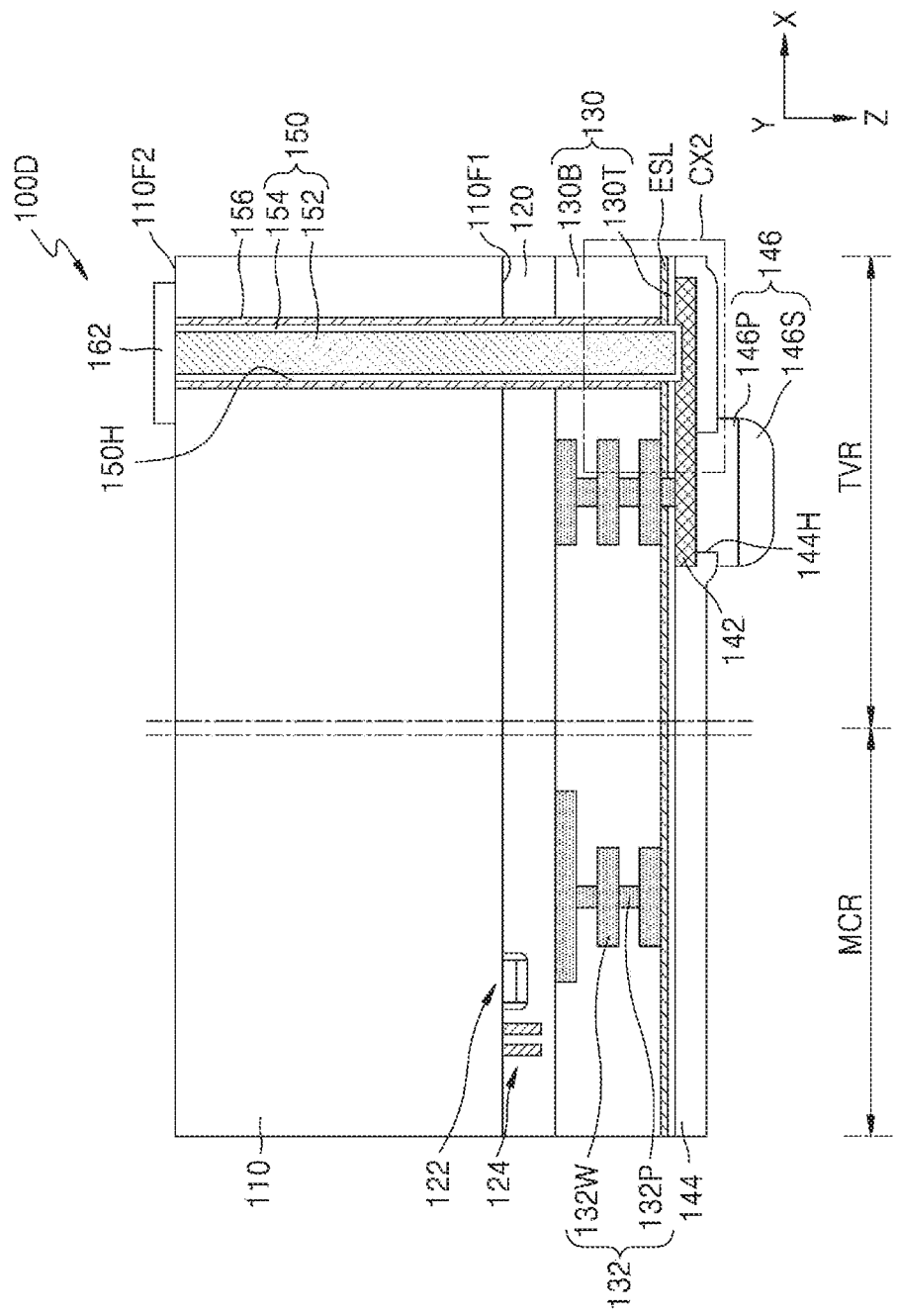
FIG. 7 is a cross-sectional view illustrating a portion of a main configuration region and a portion of a through via region of FIG. 1.
Figure 8:
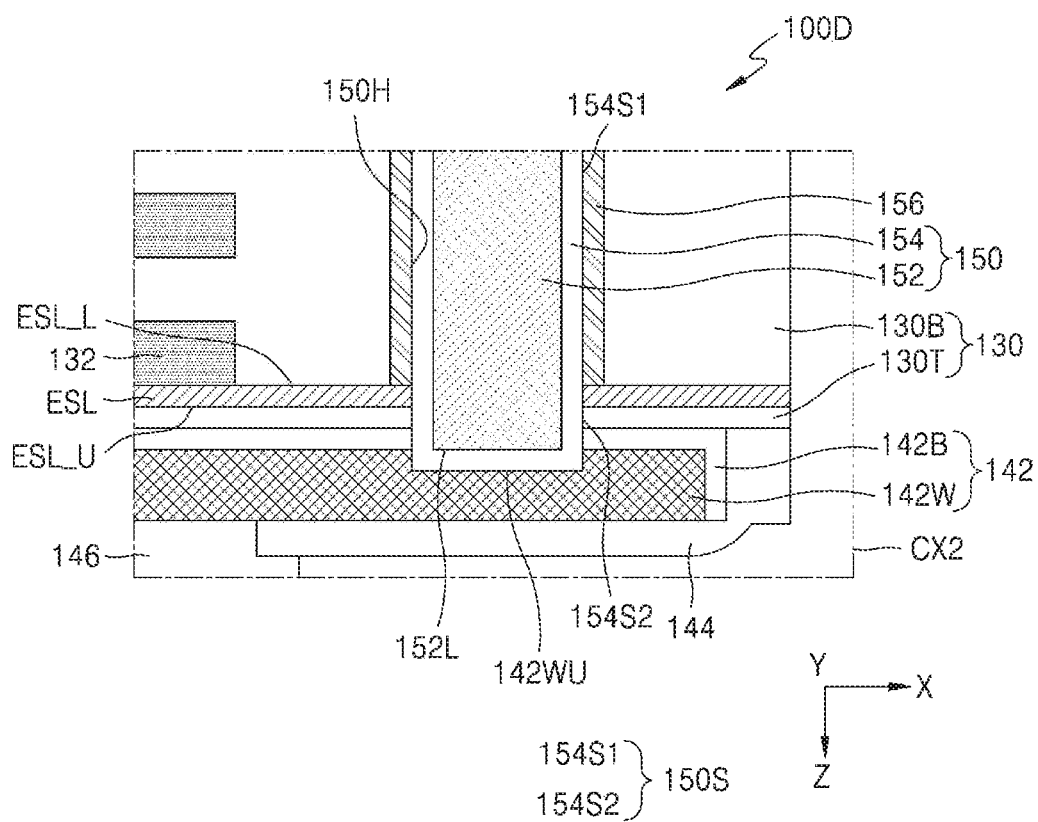
FIG. 8 is an enlarged view of a region CX2 of FIG. 7.

FIG. 7 is a cross-sectional view illustrating a portion of the main configuration region MCR and a portion of the through via region TVR of FIG. 1. FIG. 8 is an enlarged view of a region CX2 of FIG. 7.

Elements configuring a semiconductor chip 100D described below and a material included in each of the elements are substantially the same as or similar to descriptions given above with reference to FIGS. 1 to 3. Hereinafter, therefore, for convenience of description, a difference between the semiconductor chip 100D and the semiconductor chip 100 (see FIG. 3) will be mainly described.

Referring to FIGS. 7 and 8, in the semiconductor chip 100D according to some example embodiments, a through via 150 may be provided to pass through a substrate 110, an interlayer insulation layer 120, and an inter-metal insulation layer 130. Accordingly, and as shown in at least FIGS. 7-8, a through via 150 may extend through the substrate 110, the interlayer insulation layer 120, the inter-metal insulation layer 130, and the etch stop layer ESL such that the through via 150 is connected to the first pad 142 through the substrate 110, the interlayer insulation layer 120, the inter-metal insulation layer 130, and the etch stop layer ESL, and where the etch stop layer ESL is isolated from direct contact with the first pad 142.

As shown in at least FIG. 8, the via insulation layer 156 may directly contact the substrate 110, the interlayer insulation layer 120, the bottom inter-metal insulation layer 130B, and the etch stop layer ESL, and the via insulation layer 156 may not directly contact the top inter-metal insulation layer 130T and the first pad 142.

As further shown in at least FIG. 8, a lower surface ESL_L of the etch stop layer ESL, facing the upper surface of the substrate 110 (110F1) may directly contact the via insulation layer 156 and the bottom inter-metal insulation layer 130B, and an upper surface ESL_U of the etch stop layer ESL, that is opposite to the upper surface of the substrate 110 (110F1), may directly contact the top inter-metal insulation layer 130T and may not directly contact the via insulation layer 156 and the first pad 142. It will be understood that an element that is described herein to not directly contact another element may be isolated from direct contact with the other element.

The through via 150 may include a first outer wall portion surrounded by the substrate 110, a second outer wall portion surrounded by the interlayer insulation layer 120, and a third outer wall portion surrounded by the inter-metal insulation layer 130.

The through via 150 may electrically contact a first pad 142 that is on the inter-metal insulation layer 130. That is, a portion corresponding to the landing pad 134 the semiconductor chip 100 (see FIG. 3) may be the first pad 142 in the semiconductor chip 100D. In order to electrically connect the through via 150 to a multilayer wiring structure 132, the first pad 142 may extend from the inter-metal insulation layer 130. As shown in FIG. 7, a portion of the multilayer wiring structure 132 may extend through the etch stop layer ESL and directly contact the first pad 142.

In the semiconductor chip 100D according to some example embodiments, the inter-metal insulation layer 130 may include a bottom inter-metal insulation layer 130B disposed between the interlayer insulation layer 120 and the etch stop layer ESL and a top inter-metal insulation layer 130T disposed on the etch stop layer ESL. That is, the semiconductor chip 100D according to some example embodiments may be provided in a stacked structure where the etch stop layer ESL is disposed on the bottom inter-metal insulation layer 130B and the top inter-metal insulation layer 130T is disposed on the etch stop layer ESL. Restated, the inter-metal insulation layer 130 may include a bottom inter-metal insulation layer 130B on the interlayer insulation layer 120 and a top inter-metal insulation layer 130T on the bottom inter-metal insulation layer 130B, where the etch stop layer ESL is between the bottom inter-metal insulation layer 130B and the top inter-metal insulation layer 130T.

It will be understood that, the semiconductor chip 100D may include a FEOL structure on the upper surface of the substrate 110 (110F1) and a BEOL structure on the FEOL structure, where the interlayer insulation layer 120 is a portion of the FEOL structure and each of the multilayer wiring structure 132 and the inter-metal insulation layer 130 is a portion of the BEOL structure.

The etch stop layer ESL may be disposed between the bottom inter-metal insulation layer 130B and the top inter-metal insulation layer 130T. Also, the etch stop layer ESL may be disposed apart from the first pad 142 by the top inter-metal insulation layer 130T. In some example embodiments, including the example embodiments shown in at least FIGS. 7-8, the etch stop layer ESL may be a portion of the BEOL structure.

Generally, in an etching process of forming a through via hole 150H, some of metal materials included in the first pad 142 may be exposed due to an etch distribution of each of a center portion and a peripheral portion of the substrate 110, a thickness distribution of the interlayer insulation layer 120, and a thickness distribution of the inter-metal insulation layer 130. Therefore, in the etching process of forming the through via hole 150H, the etch stop layer ESL may solve a problem where an upper surface of the first pad 142 is exposed at an undesired process stage due to over-etching.

A material included in the etch stop layer ESL may have an etch selectivity with respect to a material included in the bottom inter-metal insulation layer 130B. For example, when the bottom inter-metal insulation layer 130B includes silicon oxide, the etch stop layer ESL may include silicon nitride.

As described above, since the etch stop layer ESL is disposed between the bottom inter-metal insulation layer 130B and the top inter-metal insulation layer 130T of the inter-metal insulation layer 130, the etching process of forming the through via hole 150H may include a process of exposing the etch stop layer ESL and a process of exposing the upper surface of the first pad 142, thereby maximally decreasing a degree to which the upper surface of the first pad 142 is exposed at an undesired process stage due to an etch distribution.

FIGS. 9, 10, 11, 12, 13, 14, 15, 16, and 17 are cross-sectional views illustrating a method of manufacturing a semiconductor chip in a process sequence, according to some example embodiments.

Figure 9:
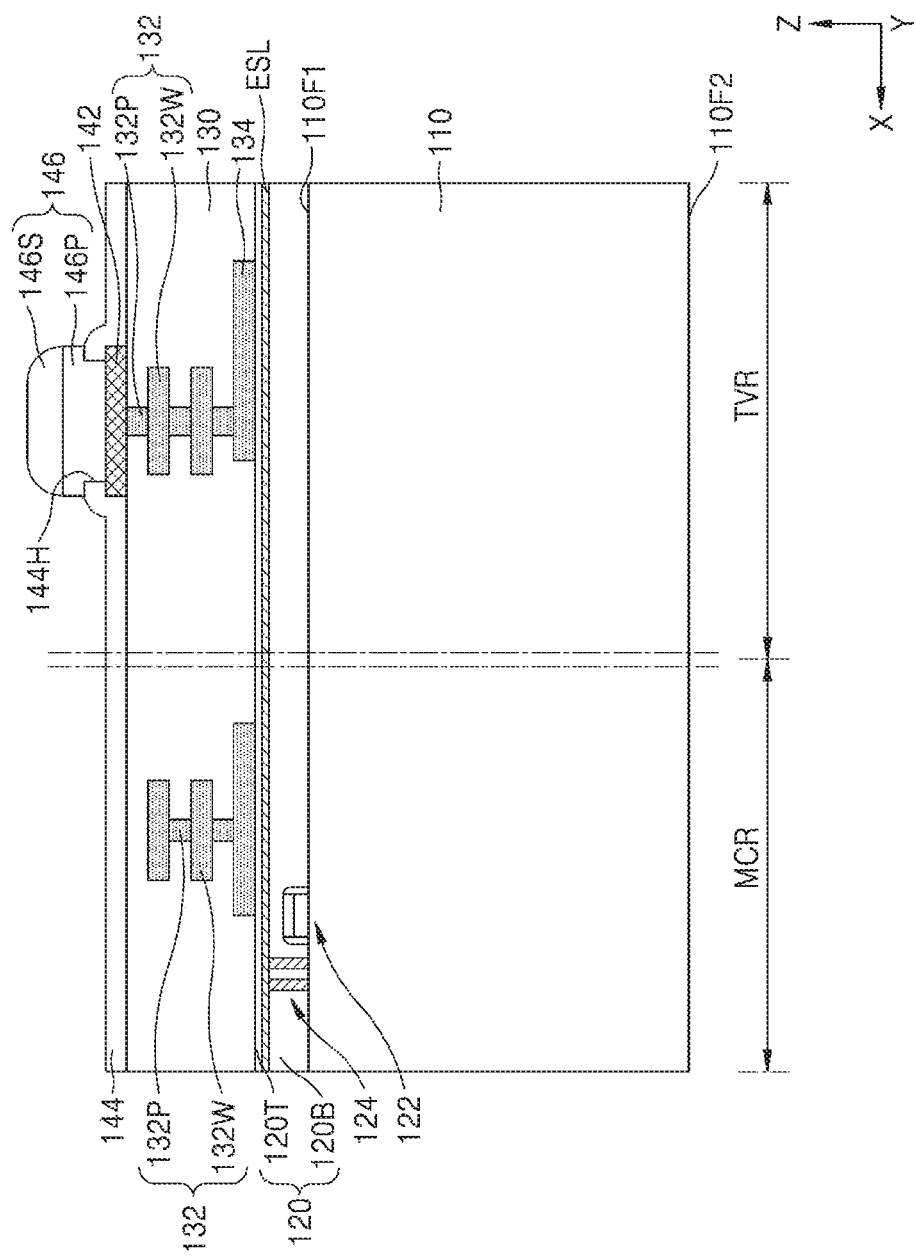
FIGS. 9, 10, 11, 12, 13, 14, 15, 16, and 17 are cross-sectional views illustrating a method of manufacturing a semiconductor chip in a process sequence, according to some example embodiments.
Figure 10:
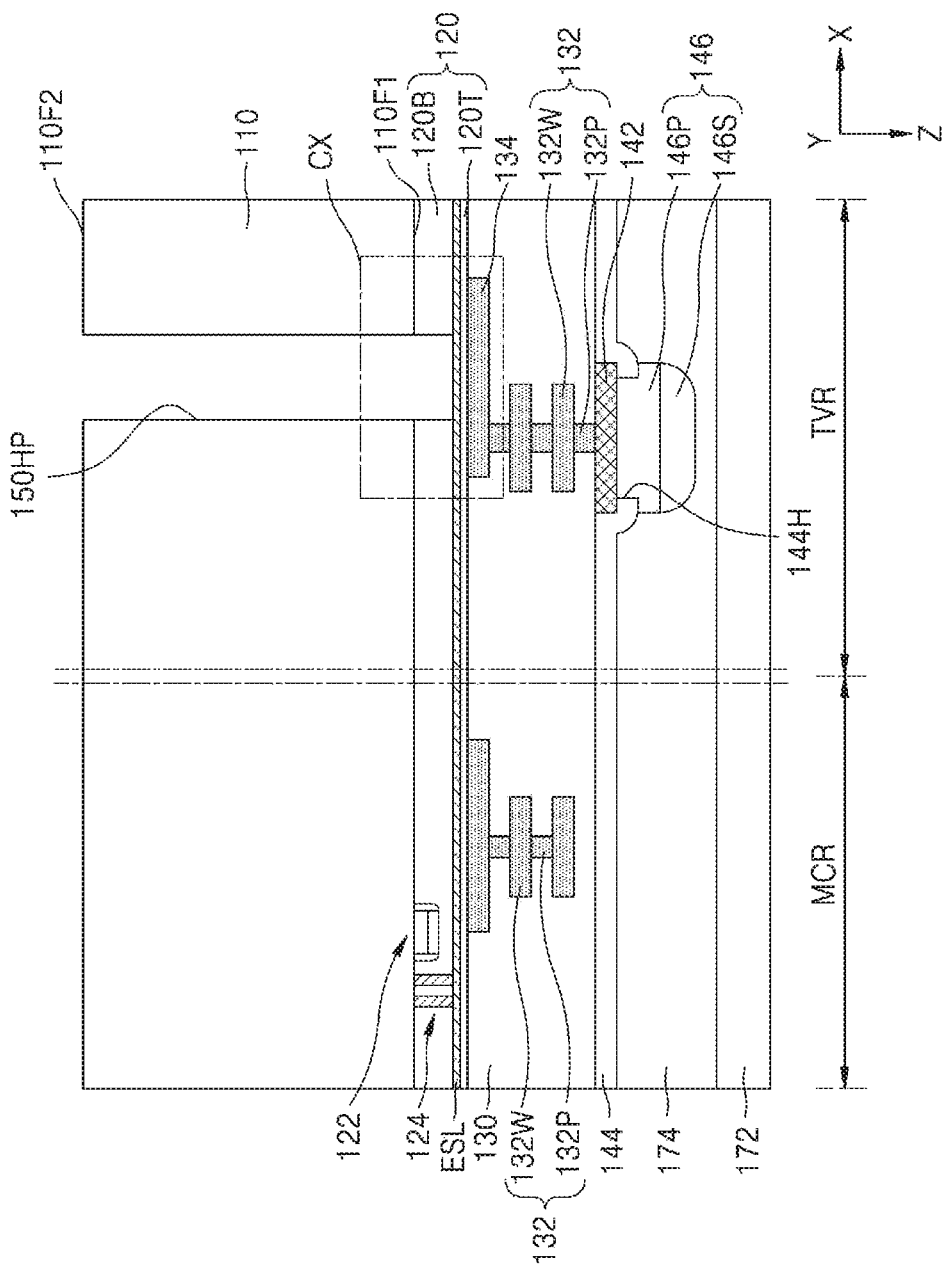
Figure 11:
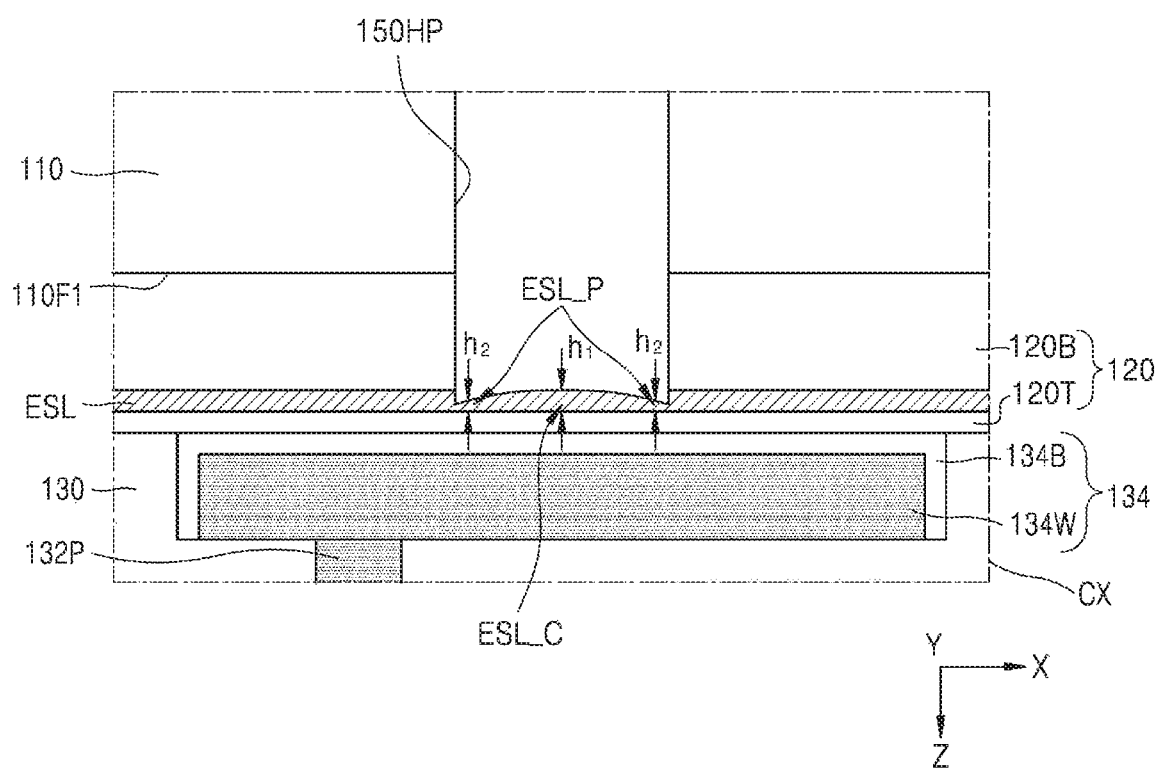
Figure 12:
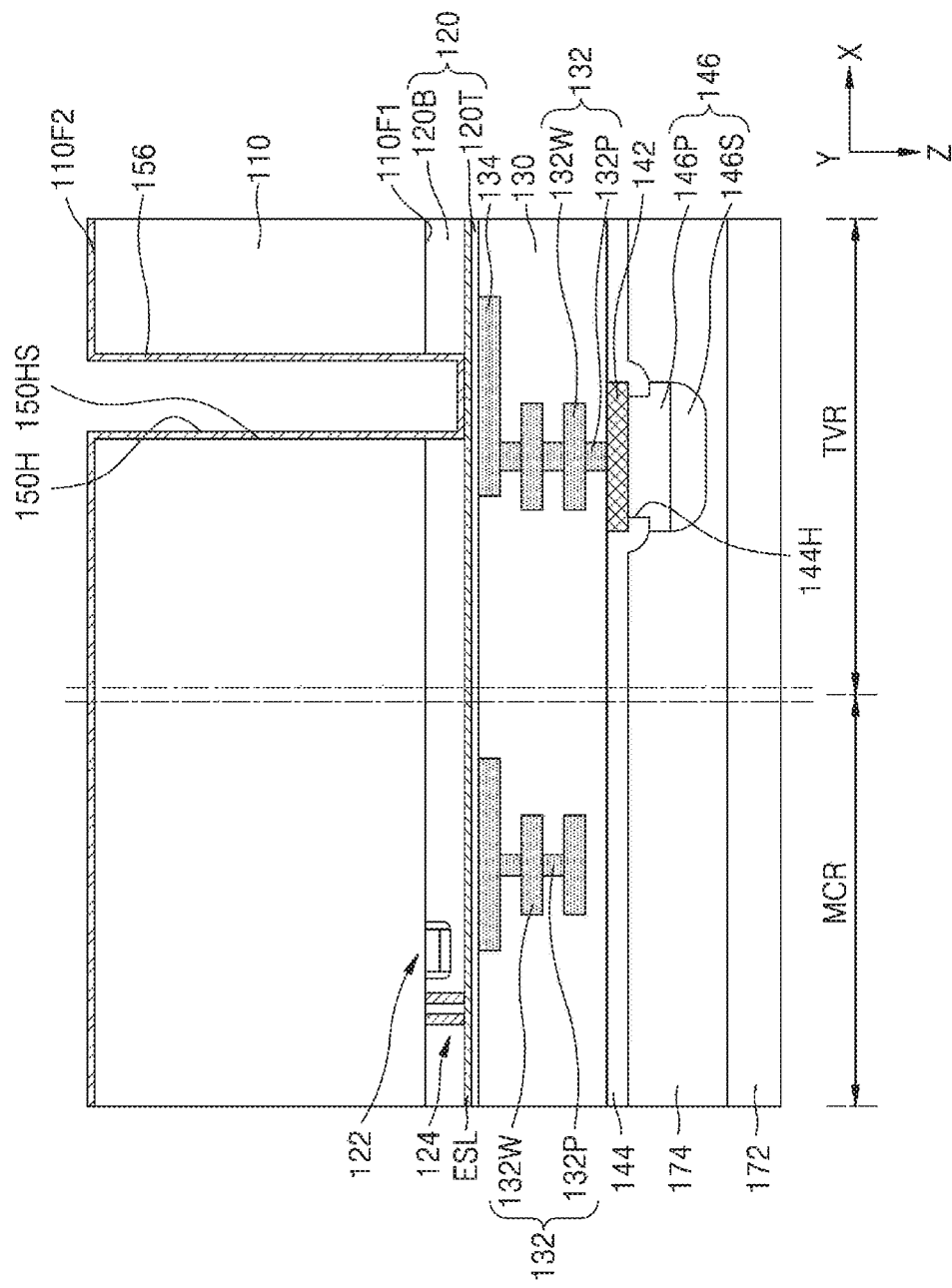
Figure 13:
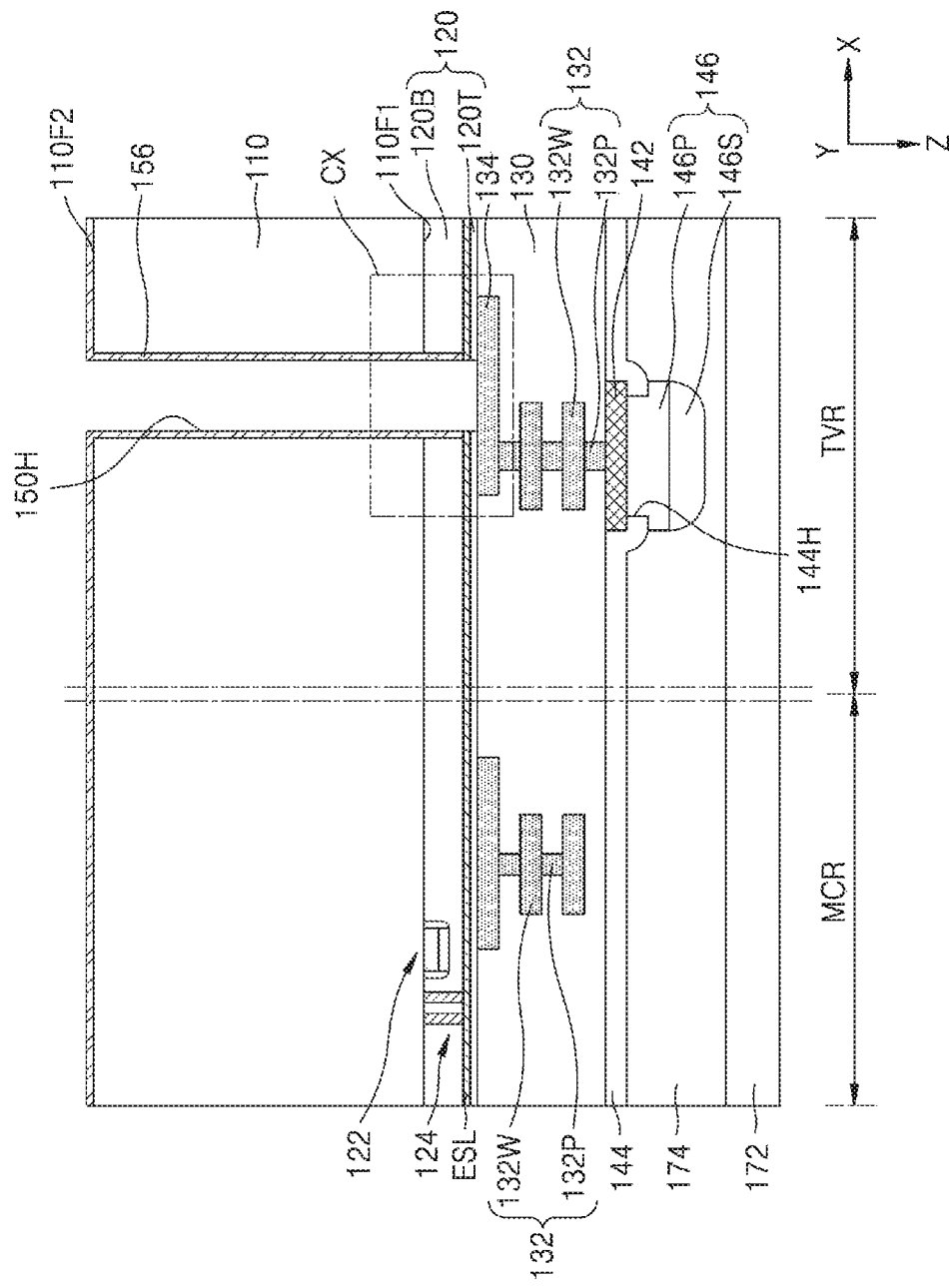

In detail, FIGS. 9, 10, 12, 13, 15, 16, and 17 are cross-sectional views illustrating a portion of the main configuration region MCR and a portion of the through via region TVR of FIG. 1, FIG. 11 is an enlarged view of a region CX of FIG. 10, and FIG. 11 is an enlarged view of a region CX of FIG. 13.

Referring to FIG. 9, a plurality of semiconductor devices 122 and a wiring structure 124 may be formed on a first surface 110F1 of a substrate 110, and an interlayer insulation layer 120 covering ("surrounding") the plurality of semiconductor devices 122 and the wiring structure 124 may be formed on the first surface 110F1 of the substrate 110, such that a bottom interlayer insulation layer 120B is formed on the first surface 110F1 of the substrate 110 and surrounds the semiconductor devices 122, an etch stop layer ESL is formed on the bottom interlayer insulation layer 120B, and a top interlayer insulation layer 120T is formed on the etch stop layer ESL.

An etch stop layer ESL may be disposed between a bottom interlayer insulation layer 120B and a top interlayer insulation layer 120T of the interlayer insulation layer 120. The interlayer insulation layer 120 may be provided in a stacked structure where the etch stop layer ESL is disposed on the bottom interlayer insulation layer 120B and the top interlayer insulation layer 120T is disposed on the etch stop layer ESL. A material included in ("a material of") the etch stop layer ESL may have an etch selectivity with respect to a material included in ("a material of") the bottom interlayer insulation layer 120B. For example, when the bottom interlayer insulation layer 120B includes silicon oxide, the etch stop layer ESL may include silicon nitride. In some example embodiments, the forming of the etch stop layer ESL may include forming a first etch stop layer ESL1 on the bottom interlayer insulation layer 120B and forming a second etch stop layer ESL2 on the first etch stop layer ESL1, where the second etch stop layer ESL2 includes a different material composition from a material composition of the first etch stop layer ESL1.

A landing pad 134, a multilayer wiring structure 132, and an inter-metal insulation layer 130 covering the landing pad 134 and the multilayer wiring structure 132 may be formed on the interlayer insulation layer 120, such that the landing pad 134 is isolated from direct contact with the etch stop layer ESL.

In some example embodiments, a process of forming the landing pad 134 and the multilayer wiring structure 132 may include a damascene process. For example, the inter-metal insulation layer 130 may be formed on the interlayer insulation layer 120, and by patterning the inter-metal insulation layer 130, a wiring hole (not shown) may be formed in a main configuration region MCR and a landing pad hole (not shown) may be formed in a through via region TVR. Subsequently, the landing pad 134 may be formed in the landing pad hole, and a wiring layer 132W may be formed in the wiring hole. For example, a first layer for forming a landing pad barrier layer 134B (see FIG. 3) and a second layer for forming a landing pad metal layer 134W (see FIG. 3) may be sequentially formed in the landing pad hole, and then, by planarizing an upper portion of each of the first and second layers so that the inter-metal insulation layer 130 is exposed, the landing pad barrier layer 134B (see FIG. 3) and the landing pad metal layer 134W (see FIG. 3) may remain in the landing pad hole.

In some example embodiments, the landing pad barrier layer 134B (see FIG. 3) may be formed by using W, WN, WC, Ti, TiN, Ta, TaN, Ru, Co, Mn, WN, Ni, or NiB through a physical vapor deposition (PVD) process or a CVD process. The landing pad metal layer 134W (see FIG. 3) may be formed by using Ni, Cu, Al, Au, W, or a combination thereof through an electroplating process. For example, in a process of the landing pad metal layer 134W (see FIG. 3), a seed layer (not shown) including Cu may be formed on the landing pad barrier layer 134B (see FIG. 3), and a Cu layer may be formed from the seed layer through an electroplating process.

Subsequently, by repeating processes similar to a process of forming the landing pad 134, the multilayer wiring structure 132 including a wiring via 132P and a wiring layer 132W may be formed on the landing pad 134.

Subsequently, a conductive layer (not shown) may be formed on the inter-metal insulation layer 130, and by patterning the conductive layer, a first pad 142 may be formed. The first pad 142 may be formed by using Al, Ni, Cu, or a combination thereof.

Subsequently, a passivation layer 144 exposing a portion of the first pad 142 may be formed on the inter-metal insulation layer 130. The passivation layer 144 may be formed by using polyimide or silicon nitride.

A bump structure 146 electrically connected to the first pad 142 exposed through the passivation layer 144, and thus a bump structure 146 that is on the first pad 142, may be formed. For example, the bump structure 146 may have a structure including a pillar 146P and a solder layer 146S. The pillar 146P may be formed by using Cu, Ni, or an alloy thereof through an electroplating process. The solder layer 146S may be formed by sequentially performing an electroplating process and a reflow process with Sn, Ag, Pb, Au, Cu, B, or an alloy thereof. The formation of the bump structure 146 may be performed subsequently to forming the through via 150 as described further below with reference to at least FIGS. 15-17.

Referring to FIGS. 10 and 11, a supporting substrate 172 may be attached on the bump structure 146 and the passivation layer 144. The supporting substrate 172 may be attached on the bump structure 146 and the passivation layer 144 through an adhesive layer 174. Subsequently, by performing a grinding process on a second surface 110F2 of the substrate 110, a portion corresponding to a certain thickness may be removed from the second surface 110F2 of the substrate 110.

A mask pattern (not shown) may be formed on the second surface 110F2 of the substrate 110, and a preliminary through via hole 150HP may be formed by etching the substrate 110 with the mask pattern as an etch mask. The preliminary through via hole 150HP may pass ("extend") through the substrate 110, from a second surface 110F2 of the substrate 110 that is opposite to the first surface 110F1 of the substrate 110, to expose the etch stop layer ESL.

An exposed surface of the etch stop layer ESL may have a profile where a center portion protrudes more than a peripheral portion. Restated, and as shown in at least FIG. 11, the forming the preliminary through via hole 150H may cause a height h1 of a center portion ESL_C of the exposed surface of the etch stop layer ESL to be greater than a height h2 of a peripheral portion ESL_P of the exposed surface of the etch stop layer ESL. The profile may occur due to two causes. In a first cause, negative electric charges may be accumulated onto a sidewall of an exposed interlayer insulation layer 120 in an etching process of etching the preliminary through via hole 150HP, and by the negative electric charges applying an attractive force to an etch positive ion which is generated in the etching process, the etch positive ion may allow a peripheral portion of the etch stop layer ESL adjacent to a sidewall of the interlayer insulation layer 120 to be relatively more etched. In a second cause, as the sidewall of the interlayer insulation layer 120 is etched to have a certain slope, the linearity of the etch positive ion may be relatively weakened, and thus, the peripheral portion of the etch stop layer ESL may be relatively more etched.

In a peripheral portion where the etch stop layer ESL is relatively less left, an etching process may be performed on the preliminary through via hole 150HP so as not to expose the top interlayer insulation layer 120T.

In some example embodiments, the preliminary through via hole 150HP may be performed through an isotropy etching process or a laser drilling process. Due to the etch stop layer ESL, the preliminary through via hole 150HP may not completely pass through the interlayer insulation layer 120, and thus, an upper surface of the landing pad 134 may be covered by the top interlayer insulation layer 120T and the etch stop layer ESL without being exposed by the preliminary through via hole 150HP.

The preliminary through via hole 150HP may be formed to have various widths, depths, and shapes. In some example embodiments, as illustrated in the drawings, the preliminary through via hole 150HP may be formed to have a sidewall vertical to a first surface 110F1 of the substrate 110. In other embodiments, in a process of forming the preliminary through via hole 150HP, a sidewall of the preliminary through via hole 150HP may be etched to have a certain slope, and thus, an upper width of the preliminary through via hole 150HP may be set greater than a lower width of the preliminary through via hole 150HP, thereby manufacturing the semiconductor chip 100A described above with reference to FIG. 4.

The preliminary through via hole 150HP exposing the etch stop layer ESL may be formed, and then, the mask pattern may be removed.

Referring to FIG. 12, a via insulation layer 156 conformally covering a sidewall of the preliminary through via hole 150HP (see FIG. 11) and the exposed surface of the etch stop layer ESL may be formed on the second surface 110F2 of the substrate 110 and an inner wall 150HS of the preliminary through via hole 150H, thereby defining a through via hole 150H.

The via insulation layer 156 may include silicon oxide, silicon nitride, silicon carbide, polymer, or a combination thereof. In some example embodiments, a CVD process may be used for forming the via insulation layer 156. For example, the via insulation layer 156 may include silicon oxide formed through a low temperature CVD process. The via insulation layer 156 may have a thickness of about 500 Å to about 3000 Å.

The via insulation layer 156 may be formed to cover the whole exposed surface of the etch stop layer ESL. That is, an upper surface of the landing pad 134 may be covered by the top interlayer insulation layer 120T, the etch stop layer ESL, and the via insulation layer 156 without being exposed by the through via hole 150H. Restated, and as shown in at least FIG. 12, the forming of the via insulation layer 156 may include conformally forming the via insulation layer 156 on a sidewall of the substrate 110, a sidewall of the bottom interlayer insulation layer 120B, and an exposed surface of the etch stop layer ESL.

Figure 14:
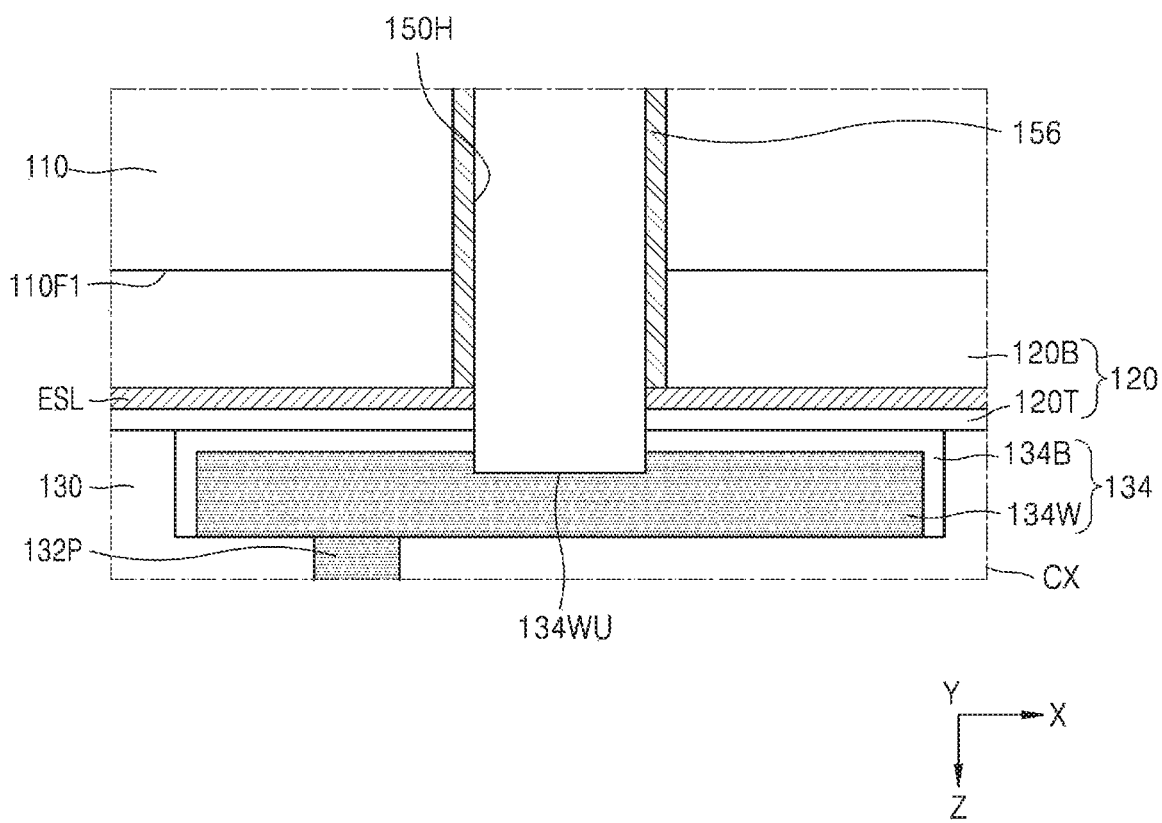

Referring to FIGS. 13 and 14, the through via hole 150H may extend downward by removing the via insulation layer 156, the etch stop layer ESL, the top interlayer insulation layer 120T, and the landing pad barrier layer 134B on a floor of the through via hole 150H so that an upper surface 134WU of the landing pad metal layer 134W is exposed. Restated, and as shown in FIGS. 13-14, a floor of the through via hole 150H may be enlarged to expose the landing pad 134.

As shown in at least FIGS. 13-14, the enlarging of the floor of the through via hole 150H may include etching an exposed surface of the via insulation layer 156 to expose the etch stop layer ESL, etching an exposed surface of the etch stop layer ESL to expose the top interlayer insulation layer 120T, and etching an exposed surface of the top interlayer insulation layer 120T to expose the landing pad 134.

The landing pad metal layer 134W may perform a function of stopping etching in an etching process of etching the through via hole 150H, and thus, the upper surface 134WU of the landing pad metal layer 134W surrounded by the landing pad barrier layer 134B may be exposed by the through via hole 150H.

In other words, material layers exposed by the through via hole 150H may include the via insulation layer 156, the etch stop layer ESL, the top interlayer insulation layer 120T, the landing pad barrier layer 134B, and the landing pad metal layer 134W. Here, the via insulation layer 156, the etch stop layer ESL, and the top interlayer insulation layer 120T may each include an insulating material, and the landing pad barrier layer 134B and the landing pad metal layer 134W may each include a conductive material.

Figure 15:
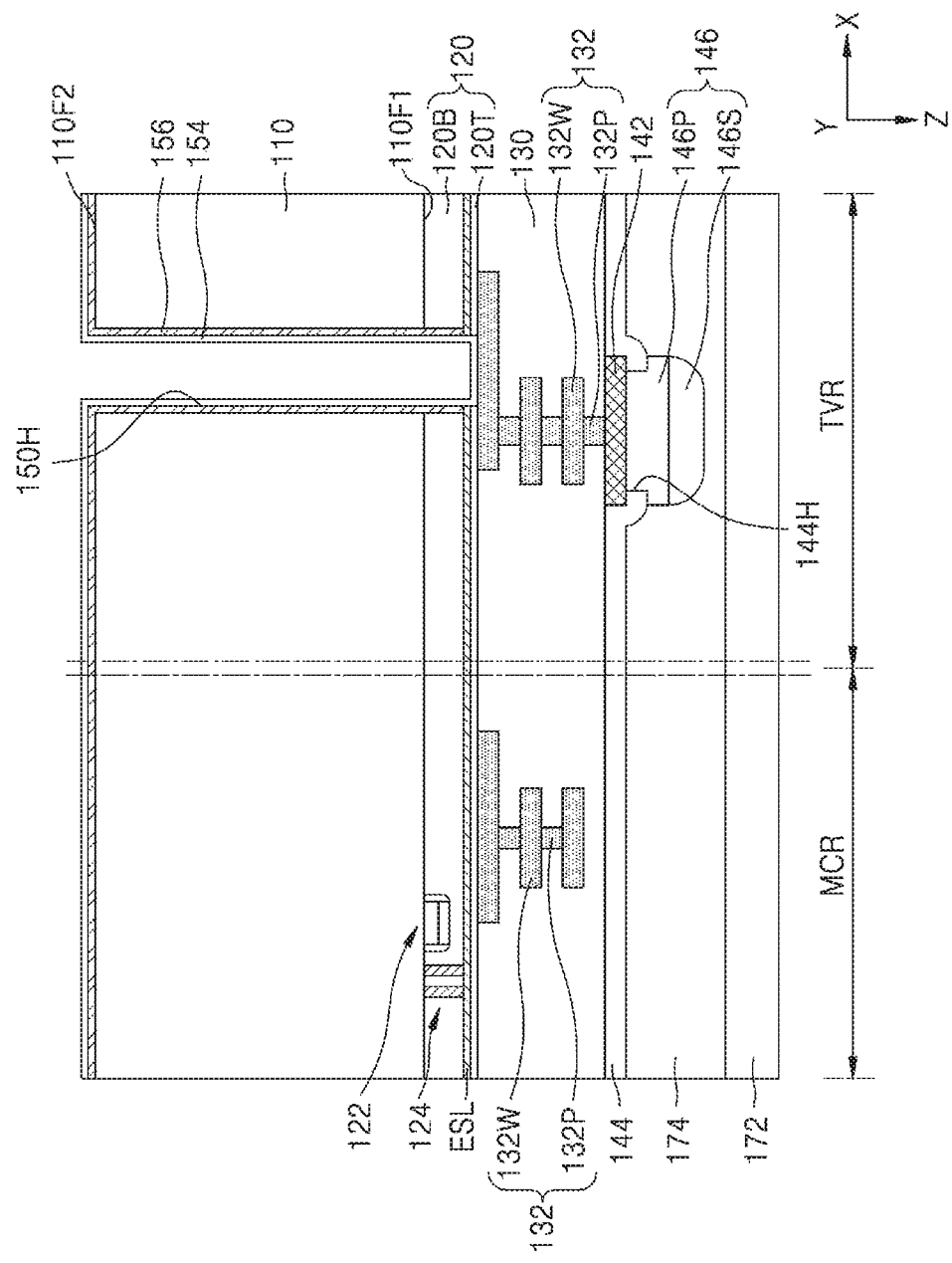

Referring to FIG. 15, a conductive barrier layer 154 may be formed on an inner wall of the through via hole 150H. The conductive barrier layer 154 may be formed by using W, WN, WC, Ti, TiN, Ta, TaN, Ru, Co, Mn, WN, Ni, or NiB through a PVD process, an electroplating process, or an electroless plating process.

The conductive barrier layer 154 may be conformally formed to cover the via insulation layer 156, the etch stop layer ESL, the top interlayer insulation layer 120T, and the landing pad barrier layer 134B each exposed at a sidewall of the through via hole 150H. Also, the conductive barrier layer 154 may be conformally formed to cover the landing pad metal layer 134W on the floor of the through via hole 150H.

Figure 16:
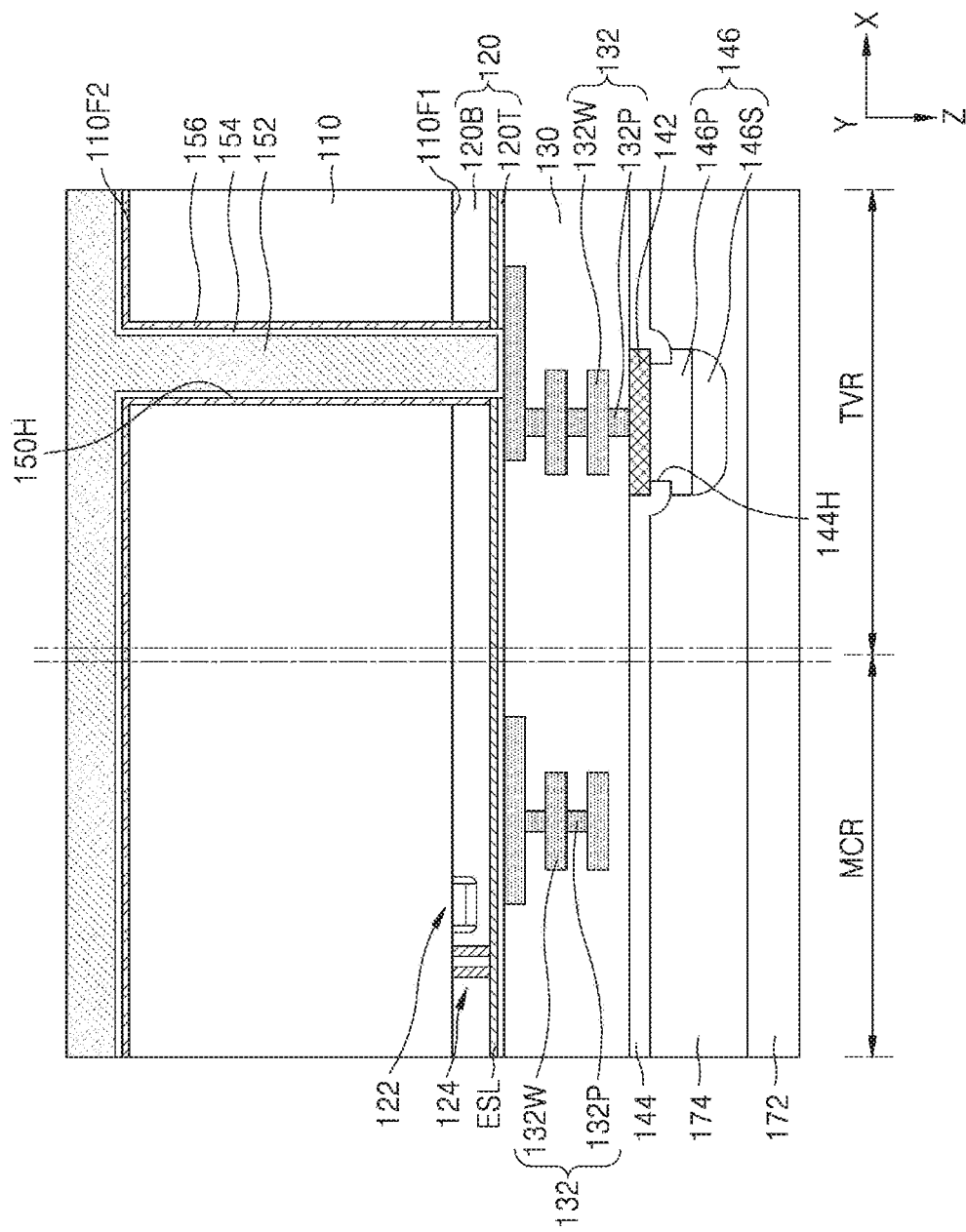

Referring to FIG. 16, a conductive plug 152 filling an inner portion of the through via hole 150H may be formed on the conductive barrier layer 154. The conductive plug 152 may be formed by using Cu, CuSn, CuMg, CuNi, CuZn, CuPd, CuAu, CuRe, CuW, W, or a W alloy through an electroplating process.

For example, in order to form the conductive plug 152, a metal seed layer (not shown) may be formed on a surface of the conductive barrier layer 154, and then, by growing a metal layer from the metal seed layer through an electroplating process, the conductive plug 152 filling the through via hole 150H may be formed on the conductive barrier layer 154. The metal seed layer may include Cu, a Cu alloy, Co, Ni, Ru, Co/Cu, or Ru/Cu and may use a PVD process for forming the metal seed layer. The electroplating process may be performed at a temperature of about 10° C. to about 65° C. In some example embodiments, the electroplating process may be performed at room temperature. Depending on the case, after the conductive plug 152 is formed, an annealing process may be performed at a temperature of about 150° C. to about 450° C. on a resultant material obtained by forming the conductive plug 152.

Figure 17:
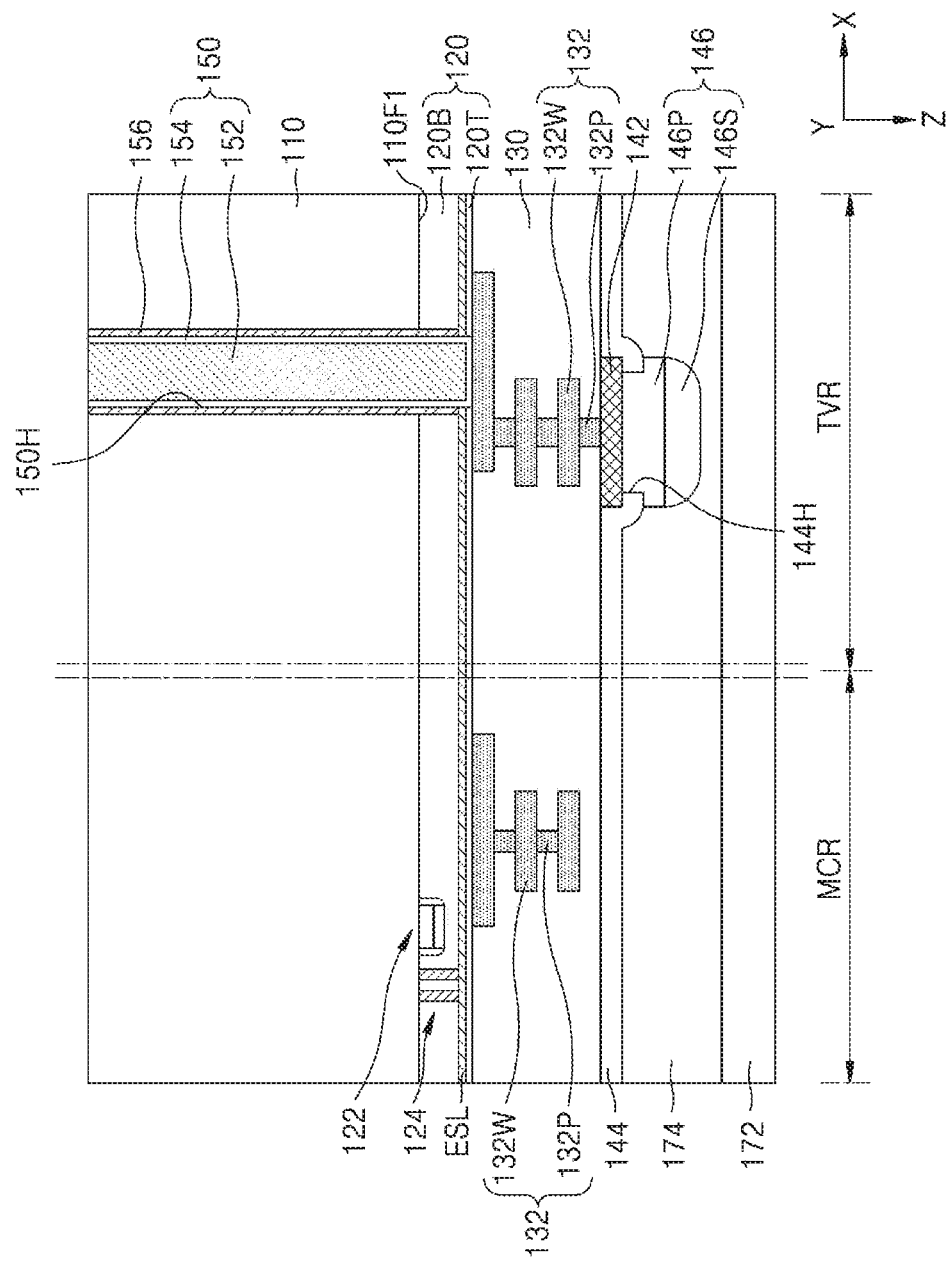

Referring to FIG. 17, by performing a chemical mechanical polishing (CMP) process on the resultant material including the conductive plug 152 so that the second surface 110F2 of the substrate 110 is exposed, the conductive plug 152 and the conductive barrier layer 154 may remain in only an inner portion of the through via hole 150H. As a result, a through via 150 filling the through via hole 150H may be formed.

Referring again to FIG. 2, a conductive layer (not shown) may be formed on the second surface 110F2 of the substrate 110, and by patterning the conductive layer, a second pad 162 electrically connected to the through via 150 may be formed.

In the method of manufacturing the semiconductor chip 100 described above, by forming the etch stop layer ESL between the bottom interlayer insulation layer 120B and the top interlayer insulation layer 120T of the interlayer insulation layer 120, the etching process of etching the through via hole 150H may include the process of exposing the etch stop layer ESL and the process of exposing the upper surface of the landing pad 134, thereby maximally decreasing a degree to which the upper surface of the landing pad 134 is exposed at an undesired process stage due to an etch distribution. Also, after the process of exposing the etch stop layer ESL, the via insulation layer 156 may be conformally formed on the sidewall of the through via hole 150H and the exposed etch stop layer ESL, and thus, the via insulation layer 156 may act as a protection layer which covers a surface of each of the substrate 110 and the interlayer insulation layer 120. Accordingly, in the process of exposing the upper surface of the landing pad 134, a metal material included in the landing pad metal layer 134W may not be directly adhered to a sidewall of the substrate 110 or the interlayer insulation layer 120, and thus, the metal material may be prevented from being polluted in the substrate 110 or the interlayer insulation layer 120, whereby the semiconductor chip 100 may have good reliability.

Figure 18:
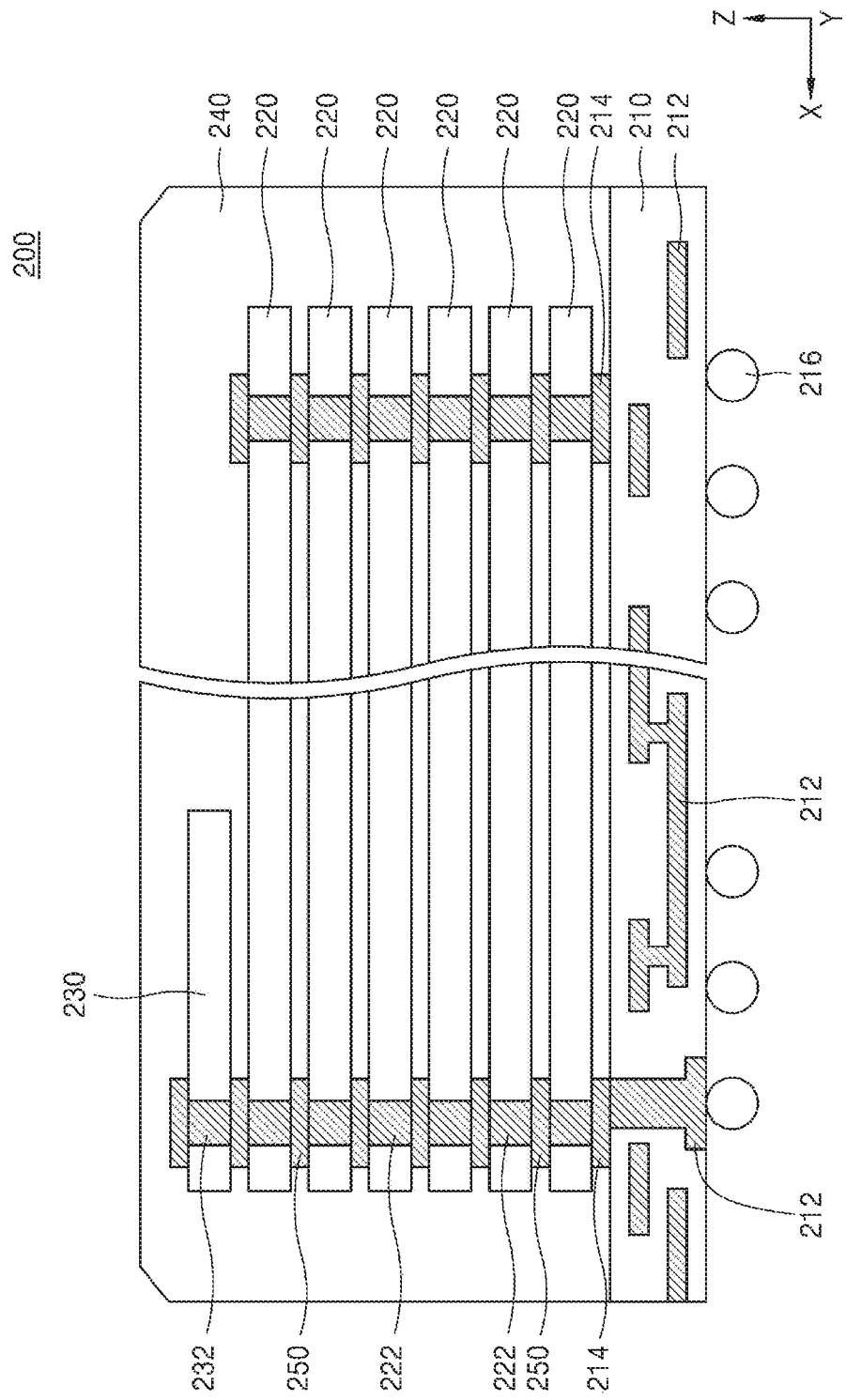
FIG. 18 is a cross-sectional view illustrating a main configuration of a semiconductor package including a semiconductor chip according to some example embodiments.

FIG. 18 is a cross-sectional view illustrating a main configuration of a semiconductor package 200 including a semiconductor chip according to some example embodiments.

Referring to FIG. 18, the semiconductor package 200 may include a plurality of semiconductor chips 220 which are sequentially stacked on a package substrate 210.

A control chip 230 may be connected to the plurality of semiconductor chips 220. A stacked structure of the plurality of semiconductor chips 220 and the control chip 230 may be sealed by a sealing member 240 such as a thermocurable resin on the package substrate 210. In the drawing, an example where six semiconductor chips 220 are vertically stacked is illustrated, but the number of semiconductor chips 220 and a direction in which the semiconductor chips 220 are stacked are not limited thereto. Depending on the case, the number of semiconductor chips 220 may increase or decrease. The plurality of semiconductor chips 220 may be arranged on the package substrate 210 in a horizontal direction, or may be arranged in a connection structure where vertical-direction mounting is combined with horizontal-direction mounting. In some example embodiments, the control chip 230 may be omitted.

The package substrate 210 may be a flexible printed circuit board, a rigid printed circuit board, or a combination thereof. The package substrate 210 may include a substrate internal wiring 212 and a connection terminal 214. The connection terminal 214 may be provided on one surface of the package substrate 210. A solder ball 216 may be provided on the other surface of the package substrate 210. The connection terminal 214 may be electrically connected to the solder ball 216 through the substrate internal wiring 212. In some example embodiments, the solder ball 216 may be replaced with a conductive bump or a lead grid array (LGA).

The plurality of semiconductor chips 220 may each include a through via 222, and the control chip 230 may include a through via 232. The through vias 222 and 232 may be electrically connected to the connection terminal 214 of the package substrate 210 by the connection member 250 such as a bump. In some example embodiments, the through via 232 may be omitted in the control chip 230.

At least one of the plurality of semiconductor chips 220 may include the semiconductor chips 100 and 100A to 100D described above with reference to FIGS. 1 to 8. Also, at least one of the plurality of semiconductor chips 220 may be manufactured by the method of manufacturing the semiconductor chip according to some example embodiments described above with reference to FIGS. 9 to 17.

Figure 19:
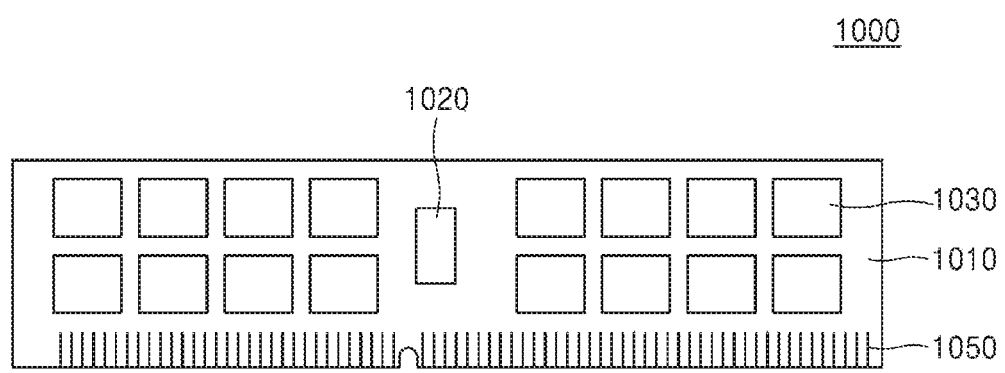
FIG. 19 is a plan view illustrating a semiconductor module including a semiconductor chip according to some example embodiments.

FIG. 19 is a plan view illustrating a semiconductor module 1000 including a semiconductor chip according to some example embodiments.

Referring to FIG. 19, the semiconductor module 1000 may include a module substrate 1010, a control chip 1020 mounted on the module substrate 1010, and a plurality of semiconductor chips 1030 mounted on the module substrate 1010.

A plurality of input/output (I/O) terminals 1050 capable being inserted into a socket of a main board may be disposed on one side of the module substrate 1010. At least one of the plurality of semiconductor chips 1030 may include the semiconductor chips 100 and 100A to 100D described above with reference to FIGS. 1 to 8. Also, at least one of the plurality of semiconductor chips 1030 may be manufactured by the method of manufacturing the semiconductor chip according to some example embodiments described above with reference to FIGS. 9 to 17.

Figure 20:
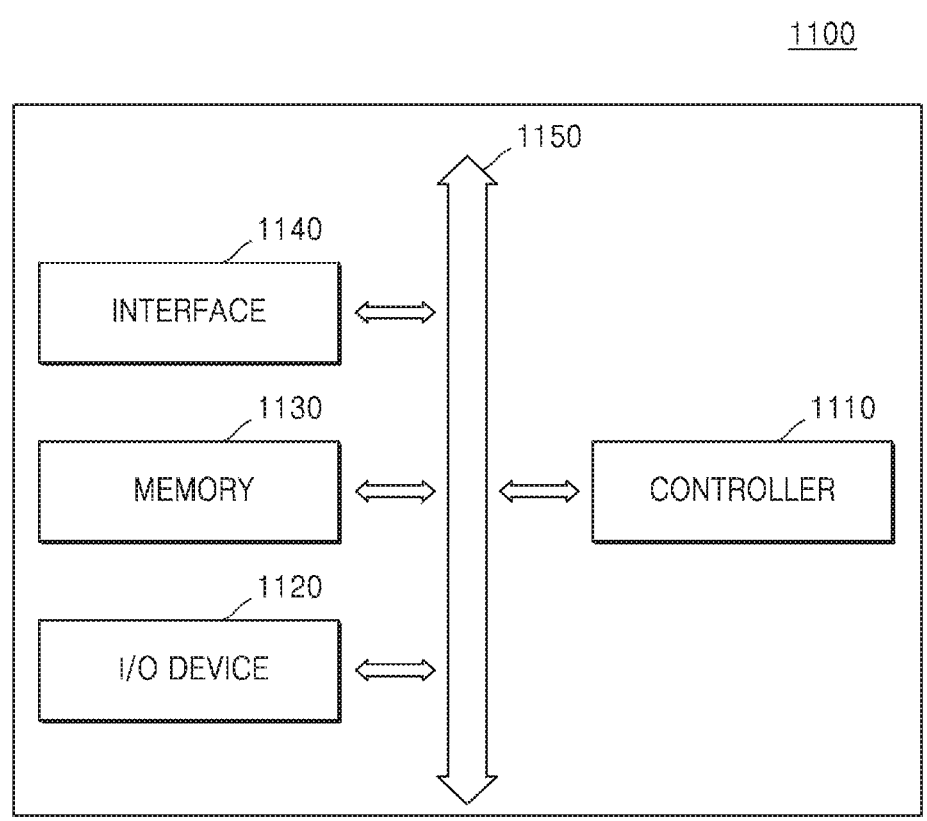
FIG. 20 is a block diagram illustrating a system including a semiconductor chip according to some example embodiments.

FIG. 20 is a block diagram illustrating a system 1100 including a semiconductor chip according to some example embodiments.

Referring to FIG. 20, the system 1100 may include a controller 1110, an I/O device 1120, a memory 1130, an interface 1140, and a bus 1150.

The system 1100 may be a mobile system or a system which transmits or receives information. In some example embodiments, the mobile system may be a portable computer, a web tablet, a mobile phone, a digital music player, or a memory card.

The controller 1110 may control an execution program in the system 1100 and may be configured with a microprocessor, a digital signal processor, a microcontroller, or a device similar thereto.

The I/O device 1120 may be used to input/output data to/from the system 1100. The system 1100 may be connected to an external device (for example, a personal computer (PC) or a network) by using the I/O device 1120 and may exchange data with the external device. The I/O device 1120 may be, for example, a touch pad, a keyboard, or a display.

The memory 1130 may store data for an operation of the controller 1110, or may store data obtained through processing by the controller 1110. The memory 1130 may include the semiconductor chips 100 and 100A to 100D described above with reference to FIGS. 1 to 8. Also, the memory 1130 may be manufactured by the method of manufacturing the semiconductor chip according to some example embodiments described above with reference to FIGS. 9 to 17.

The interface 1140 may be a data transmission path between the system 1100 and the external device. The controller 1110, the I/O device 1120, the memory 1130, and the interface 1140 may communicate with one another through the bus 1150.

While the inventive concepts has been particularly shown and described with reference to embodiments thereof, it will be understood that various changes in form and details may be made therein without departing from the spirit and scope of the following claims.

What is claimed is:

1. A semiconductor chip, comprising:
   a substrate;
   an interlayer insulation layer including
      a bottom interlayer insulation layer on an upper surface of the substrate, and
      a top interlayer insulation layer on the bottom interlayer insulation layer;
   an etch stop layer between the bottom interlayer insulation layer and the top interlayer insulation layer;
   a landing pad on the interlayer insulation layer, the landing pad including a landing pad metal layer and a landing pad barrier layer, the landing pad barrier layer surrounding an upper surface of the landing pad metal layer and a side surface of the landing pad metal layer, the landing pad barrier layer being at least partially between the landing pad metal layer and the top interlayer insulation layer; and
   a through via connected to the landing pad through the substrate, the interlayer insulation layer, and the etch stop layer,
   wherein the etch stop layer is isolated from direct contact with the landing pad,
   wherein the through via extends through a through via hole that exposes the landing pad barrier layer, the upper surface of the landing pad metal layer, and an inner sidewall of the landing pad metal layer, the through via extends through the landing pad barrier layer and directly contacts the landing pad metal layer, and a sidewall of the through via directly contacts the inner sidewall of the landing pad metal layer.

2. The semiconductor chip of claim 1, further comprising:
   a via insulation layer surrounding a limited portion of the sidewall of the through via,
   wherein the via insulation layer directly contacts the etch stop layer and does not directly contact the landing pad.

3. The semiconductor chip of claim 2, wherein the sidewall of the through via directly contacts the via insulation layer, the etch stop layer, the top interlayer insulation layer, and the landing pad.

4. The semiconductor chip of claim 2, wherein
   a lower surface of the etch stop layer facing the upper surface of the substrate directly contacts the via insulation layer and the bottom interlayer insulation layer, and an upper surface of the etch stop layer opposite to the upper surface of the substrate directly contacts the top interlayer insulation layer and does not directly contact the via insulation layer and the landing pad.

5. The semiconductor chip of claim 4, wherein
one sidewall of the via insulation layer directly contacts the through via,
another sidewall of the via insulation layer directly contacts the substrate and the bottom interlayer insulation layer, and
an upper surface of the via insulation layer opposite to the upper surface of the substrate directly contacts the lower surface of the etch stop layer.

6. The semiconductor chip of claim 1, wherein a material of the etch stop layer has an etch selectivity with respect to a material of the bottom interlayer insulation layer.

7. The semiconductor chip of claim 1, wherein
a thickness of the bottom interlayer insulation layer is greater than a thickness of the etch stop layer, and
the thickness of the etch stop layer is substantially equal to or greater than a thickness of the top interlayer insulation layer.

8. The semiconductor chip of claim 1, wherein
at least a portion of the through via has a cross-section having a cross-section width which is progressively narrowed in proportion to distance of the cross-section of the portion of the through via from a bottom surface of the substrate in a direction extending along a longitudinal axis of the through via away from the bottom surface of the substrate, and
the landing pad has a cross-section having a cross-section width which is progressively widened in proportion to distance of the cross-section of the landing pad from the bottom surface of the substrate in the direction extending along the longitudinal axis of the through via away from the bottom surface of the substrate.

9. The semiconductor chip of claim 1, wherein a material composition of the bottom interlayer insulation layer is different from a material composition of the top interlayer insulation layer.

10. The semiconductor chip of claim 1, wherein the etch stop layer includes a stack of a plurality of different material layers.

11. A semiconductor chip, comprising:
a substrate;
an interlayer insulation layer on an upper surface of the substrate, the interlayer insulation layer surrounding a semiconductor device;
an inter-metal insulation layer surrounding a metal wiring and including
a bottom inter-metal insulation layer on the interlayer insulation layer, and
a top inter-metal insulation layer on the bottom inter-metal insulation layer;
an etch stop layer between the bottom inter-metal insulation layer and the top inter-metal insulation layer;
a landing pad on the inter-metal insulation layer, the landing pad including a landing pad metal layer and a landing pad barrier layer, the landing pad barrier layer surrounding an upper surface of the landing pad metal layer and a side surface of the landing pad metal layer, the landing pad barrier layer being at least partially between the landing pad metal layer and the top inter-metal insulation layer;
a bump structure on the landing pad; and
a through via connected to the landing pad through the substrate, the interlayer insulation layer, the inter-metal insulation layer, and the etch stop layer,
wherein the etch stop layer is isolated from direct contact with the landing pad,
wherein the through via extends through a through via hole that exposes the landing pad barrier layer, the upper surface of the landing pad metal layer, and an inner sidewall of the landing pad metal layer, the through via extends through the landing pad barrier layer and directly contacts the landing pad metal layer, and a sidewall of the through via directly contacts the inner sidewall of the landing pad metal layer.

12. The semiconductor chip of claim 11, further comprising:
a via insulation layer surrounding a limited portion of the sidewall of the through via,
wherein
the via insulation layer directly contacts the substrate, the interlayer insulation layer, the bottom inter-metal insulation layer, and the etch stop layer, and
the via insulation layer does not directly contact the top inter-metal insulation layer and the landing pad.

13. The semiconductor chip of claim 12, wherein
a lower surface of the etch stop layer facing the upper surface of the substrate directly contacts the via insulation layer and the bottom inter-metal insulation layer, and
an upper surface of the etch stop layer opposite to the upper surface of the substrate directly contacts the top inter-metal insulation layer and does not directly contact the via insulation layer and the landing pad.

14. The semiconductor chip of claim 11, further comprising:
a front-end-of-line (FEOL) structure on the upper surface of the substrate; and
a back-end-of-line (BEOL) structure on the FEOL structure,
wherein
the interlayer insulation layer is a portion of the FEOL structure, and
each of the metal wiring and the inter-metal insulation layer is a portion of the BEOL structure.

15. The semiconductor chip of claim 14, wherein
the etch stop layer is another portion of the BEOL structure, and
a portion of the metal wiring extends through the etch stop layer and directly contacts the landing pad.

16. A method of manufacturing a semiconductor chip, the method comprising:
forming a semiconductor device on a first surface of a substrate;
forming a bottom interlayer insulation layer on the first surface of the substrate, such that the bottom interlayer insulation layer surrounds the semiconductor device;
forming an etch stop layer on the bottom interlayer insulation layer;
forming a top interlayer insulation layer on the etch stop layer;
forming a landing pad on the top interlayer insulation layer, such that the landing pad is isolated from direct contact with the etch stop layer, the landing pad including a landing pad metal layer and a landing pad barrier layer, the landing pad barrier layer surrounding an upper surface of the landing pad metal layer and a side surface of the landing pad metal layer, the landing pad barrier layer being at least partially between the landing pad metal layer and the top interlayer insulation layer;

forming a preliminary through via hole that extends through the substrate, from a second surface of the substrate that is opposite to the first surface of the substrate, to expose the etch stop layer;

forming a via insulation layer on an inner wall of the preliminary through via hole to define a through via hole;

enlarging a floor of the through via hole to expose the landing pad barrier layer, the upper surface of the landing pad metal layer, and an inner sidewall of the landing pad metal layer; and forming a through via filling the through via hole, such that the through via extends through the landing pad barrier layer and directly contacts the landing pad metal layer, and a sidewall of the through via directly contacts the inner sidewall of the landing pad metal layer.

17. The method of claim 16, wherein the forming the via insulation layer includes conformally forming the via insulation layer on a sidewall of the substrate, a sidewall of the bottom interlayer insulation layer, and an exposed surface of the etch stop layer.

18. The method of claim 16, wherein the enlarging of the floor of the through via hole includes
   etching an exposed surface of the via insulation layer to expose the etch stop layer;
   etching an exposed surface of the etch stop layer to expose the top interlayer insulation layer; and
   etching an exposed surface of the top interlayer insulation layer to expose the upper surface of the landing pad.

19. The method of claim 18, wherein a material of the etch stop layer has an etch selectivity with respect to a material of the bottom interlayer insulation layer.

20. The method of claim 16, wherein the forming the preliminary through via hole causes a height of a center portion of an exposed surface of the etch stop layer to be greater than a height of a peripheral portion of the exposed surface of the etch stop layer.

* * * * *